US012593440B2

(12) United States Patent
Lee et al.

(10) Patent No.: US 12,593,440 B2
(45) Date of Patent: Mar. 31, 2026

(54) SEMICONDUCTOR DEVICE INCLUDING SINGLE CRYSTAL SEMICONDUCTOR PATTERN WITH COMPLEMENTARY STRUCTURE

(71) Applicant: SAMSUNG ELECTRONICS CO., LTD., Suwon-si (KR)

(72) Inventors: Jeonil Lee, Suwon-si (KR); Kyunghwan Lee, Suwon-si (KR); Min Hee Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 285 days.

(21) Appl. No.: 18/200,135

(22) Filed: May 22, 2023

(65) Prior Publication Data

US 2023/0389290 A1 Nov. 30, 2023

(30) Foreign Application Priority Data

May 24, 2022 (KR) ........................ 10-2022-0063376

(51) Int. Cl.
*H10B 53/10* (2023.01)
*H10B 12/00* (2023.01)
*H10B 53/30* (2023.01)
*H10D 62/13* (2025.01)

(52) U.S. Cl.
CPC ......... *H10B 12/315* (2023.02); *H10B 12/482* (2023.02); *H10B 12/485* (2023.02); *H10B 53/10* (2023.02); *H10B 53/30* (2023.02); *H10D 62/151* (2025.01)

(58) Field of Classification Search
None
See application file for complete search history.

(56) References Cited

U.S. PATENT DOCUMENTS

| | | | |
|---|---|---|---|
| 5,656,842 A | 8/1997 | Iwamatsu et al. | |
| 8,248,876 B2 | 8/2012 | Masuoka et al. | |
| 9,245,976 B2 | 1/2016 | Cho et al. | |
| 11,018,255 B2 | 5/2021 | Liu et al. | |
| 2014/0256104 A1 | 9/2014 | Nagai | |

(Continued)

FOREIGN PATENT DOCUMENTS

JP 2019-169490 A 10/2019

OTHER PUBLICATIONS

Chen et al., Journal of Alloys and Compounds, vol. 647, pp. 1035-1039 (2015).

*Primary Examiner* — Daniel Whalen
(74) *Attorney, Agent, or Firm* — Muir Patent Law, PLLC

(57) ABSTRACT

A semiconductor device includes a first single crystal semiconductor pattern including a first source/drain region, a second source/drain region, and a first vertical channel region between the first source/drain region and the second source/drain region, the second source/drain region being at a higher level than the first source/drain region; a first gate electrode facing a first side surface of the first single crystal semiconductor pattern; a first gate dielectric layer, the first gate dielectric layer including a portion between the first single crystal semiconductor pattern and the first gate electrode; and a complementary structure in contact with a second side surface of the first single crystal semiconductor pattern, wherein the complementary structure includes an oxide semiconductor layer.

20 Claims, 28 Drawing Sheets

(56)                         References Cited

U.S. PATENT DOCUMENTS

| 2015/0187956 A1 | 7/2015 | Ahmed |
| 2019/0081180 A1* | 3/2019 | Park .................. H10D 30/6735 |
| 2019/0296155 A1 | 9/2019 | Sawabe et al. |
| 2020/0185504 A1 | 6/2020 | Sharma et al. |
| 2021/0384354 A1 | 12/2021 | Karda et al. |
| 2022/0069133 A1* | 3/2022 | Hwang ............. H10D 86/0221 |
| 2022/0077320 A1* | 3/2022 | Pulugurtha .......... H10D 64/691 |

* cited by examiner

SEMICONDUCTOR DEVICE INCLUDING SINGLE CRYSTAL SEMICONDUCTOR PATTERN WITH COMPLEMENTARY STRUCTURE

CROSS-REFERENCE TO RELATED APPLICATION

This application claims benefit of priority to Korean Patent Application No. 10-2022-0063376 filed on May 24, 2022, in the Korean Intellectual Property Office, the disclosure of which is incorporated herein by reference in its entirety.

BACKGROUND

1. Field

Embodiments relate to a semiconductor device.

2. Description of the Related Art

Research has been conducted to reduce the sizes of elements included in a semiconductor device and to improve the performance of the elements. For example, research has been conducted to reliably and stably form elements with reduced sizes in memory devices such as DRAMs.

SUMMARY

The embodiments may be realized by providing a semiconductor device including a first single crystal semiconductor pattern including a first source/drain region, a second source/drain region, and a first vertical channel region between the first source/drain region and the second source/drain region, the second source/drain region being at a higher level than the first source/drain region; a first gate electrode facing a first side surface of the first single crystal semiconductor pattern; a first gate dielectric layer, the first gate dielectric layer including a portion between the first single crystal semiconductor pattern and the first gate electrode; and a complementary structure in contact with a second side surface of the first single crystal semiconductor pattern, wherein the complementary structure includes an oxide semiconductor layer.

The embodiments may be realized by providing a semiconductor device including a first conductive line and a second conductive line at a same level, the first conductive line and the second conductive line being parallel to each other; a first single crystal semiconductor pattern and a second single crystal semiconductor pattern spaced apart from each other; and a complementary structure between the first single crystal semiconductor pattern and the second single crystal semiconductor pattern, the complementary structure including an oxide semiconductor layer, wherein a portion of a structure including the first single crystal semiconductor pattern, the second single crystal semiconductor pattern, and the complementary structure is between the first conductive line and the second conductive line.

The embodiments may be realized by providing a semiconductor device including first single crystal semiconductor patterns spaced apart from each other in a first direction; second single crystal semiconductor patterns spaced apart from each other in the first direction, and spaced apart from the first single crystal semiconductor patterns in a second direction, intersecting the first direction; and complementary structures between the first single crystal semiconductor patterns and the second single crystal semiconductor patterns, wherein each of the complementary structures is between adjacent ones of the first single crystal semiconductor patterns and the second single crystal semiconductor patterns in the second direction, each of the first single crystal semiconductor pattern and the second single crystal semiconductor pattern includes a first semiconductor material having a first energy band gap, and each of the complementary structures includes a second semiconductor material having a second energy band gap greater than the first energy band gap.

BRIEF DESCRIPTION OF DRAWINGS

Features will be apparent to those of skill in the art by describing in detail exemplary embodiments with reference to the attached drawings in which.

DETAILED DESCRIPTION

Hereinafter, terms such as "upper portion," "middle portion," and "lower portion" may be replaced with other terms, for example, "first," "second," and "third" to describe elements of the specification. Terms such as "first," "second," and "third" may be used to describe different elements, but the elements are not limited by the terms, e.g., do not imply sequential inclusion, and a "first element" may be referred to as a "second element."

Figure 1:
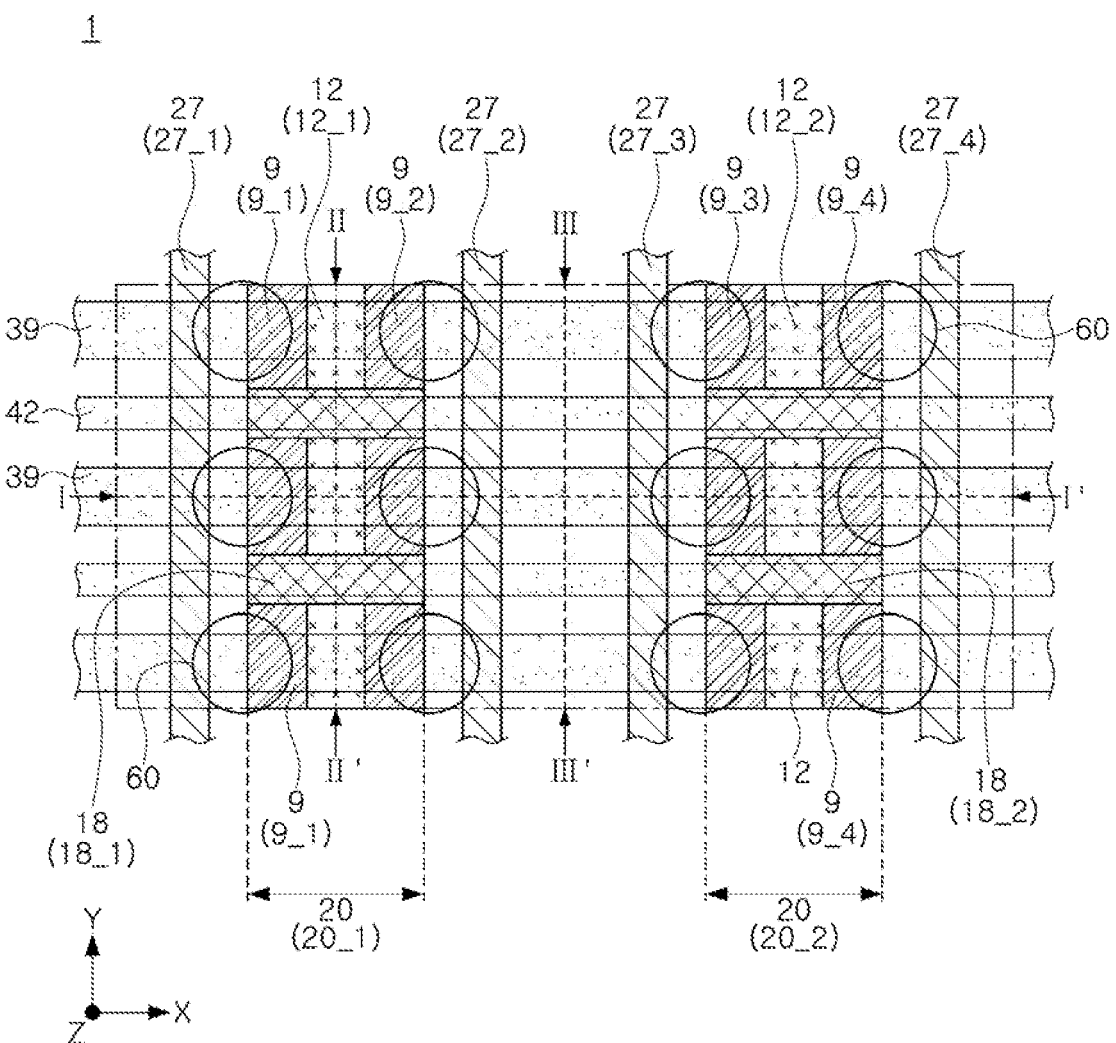
FIGS. 1, 2A, and 2B are schematic diagrams illustrating a semiconductor device according to an example embodiment.
Figure 2A:
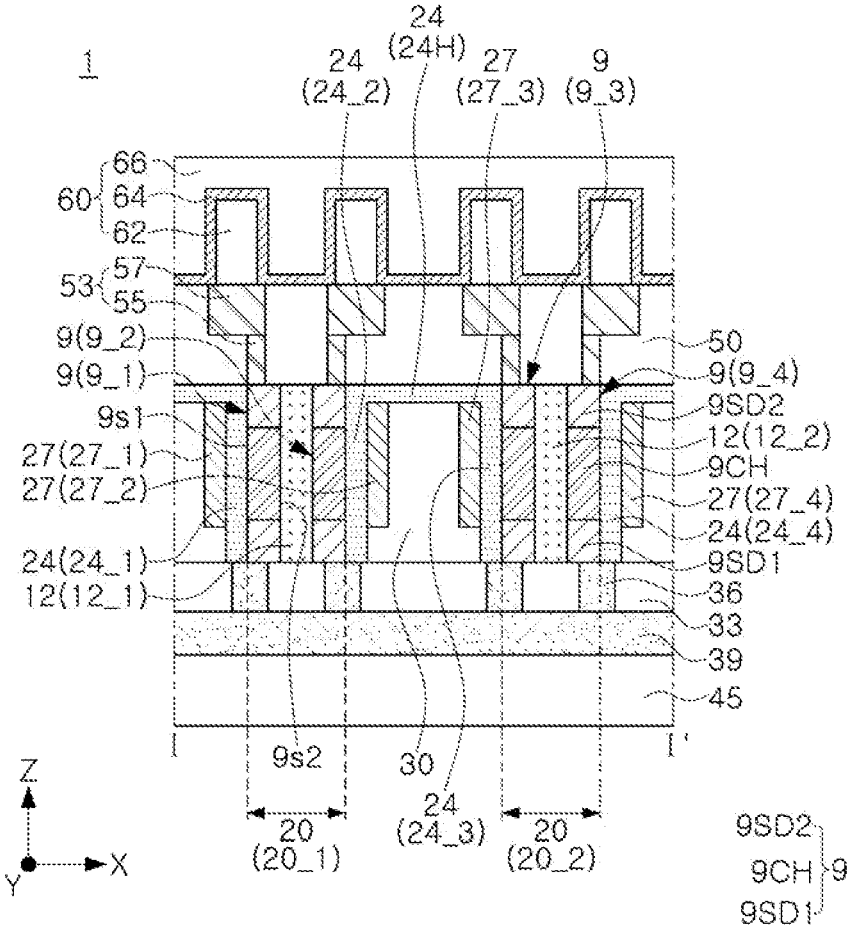
Figure 2B:
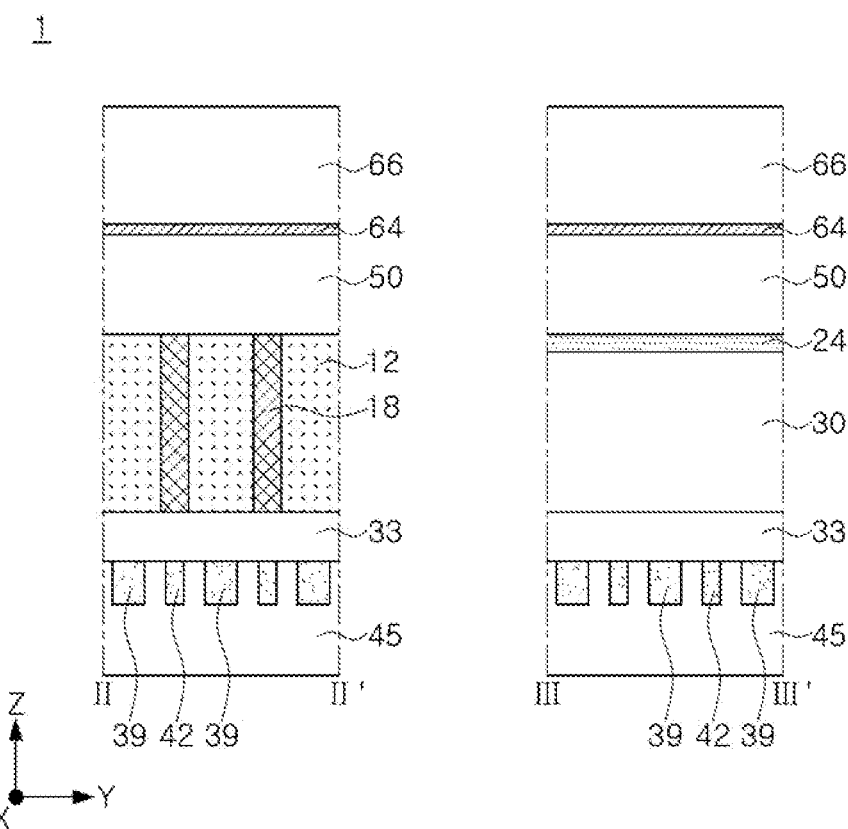

A semiconductor device according to an example embodiment will be described with reference to FIGS. 1, 2A and 2B. FIG. 1 is a schematic top view illustrating a semiconductor device according to an example embodiment. FIG. 2A is a schematic cross-sectional view illustrating a region taken along line I-I' of FIG. 1. FIG. 2B is a schematic cross-sectional view illustrating regions taken along line II-II' and line III-III' of FIG. 1.

Referring to FIGS. 1, 2A, and 2B, a semiconductor device 1 according to an example embodiment may include a plurality of structures 20 spaced apart from each other. Each of the structures 20 may have a line shape extending (e.g., lengthwise) in a first direction Y, and the structures 20 may be spaced apart from each other in a second direction X, intersecting the first direction Y. The second direction X may be perpendicular to the first direction Y. In an implementation, the structures 20 may include a first structure 20_1 and a second structure 20_2 adjacent to each other and spaced apart from each other in the second direction X.

Each of the structures 20 may include semiconductor patterns 9 and complementary structures 12.

The semiconductor patterns 9 may be formed of a single crystal semiconductor material. In an implementation, the semiconductor patterns 9 may include, e.g., a group IV semiconductor, a group III-V compound semiconductor, or a group II-VI compound semiconductor. The plurality of semiconductor patterns 9 may be a single crystal semiconductor including silicon, silicon carbide, germanium, or silicon-germanium. In an implementation, the semiconductor patterns 9 may be single crystal silicon patterns or single crystal silicon carbide patterns. The semiconductor patterns 9 may be referred to as "single crystal semiconductor patterns." As used herein, the term "or" is not an exclusive term, e.g., "A or B" would include A, B, or A and B.

Each of the semiconductor patterns 9 may include a first source/drain region 9SD1, a second source/drain region 9SD2, and a channel region 9CH between the first and second source/drain regions 9SD1 and 9SD2. The channel region 9CH may be a vertical channel region. The second source/drain regions 9SD2 may be at a higher level (e.g., farther from a substrate in a vertical third direction Z) than the first source/drain regions 9SD1.

In an implementation, the first and second source/drain regions 9SD1 and 9SD2 may have a first conductivity type, and the channel region 9CH may have a second conductivity type different from the first conductivity type. In an implementation, the first conductivity type may be N-type conductivity, and the second conductivity type may be P-type conductivity. In an implementation, the channel region 9CH may be an intrinsic semiconductor region.

The semiconductor patterns 9 may include first semiconductor patterns 9_1 spaced apart from each other in the first direction Y, and second semiconductor patterns 9_2 spaced apart from each other in the first direction Y, and spaced apart from the first semiconductor patterns 9_1 in the second direction X, intersecting the first direction Y.

The semiconductor patterns 9 may further include third semiconductor patterns 9_3 spaced apart from each other in the first direction Y, and fourth semiconductor patterns 9_4 spaced apart from each other in the first direction Y, and spaced apart from the third semiconductor patterns 9_3 in the second direction X.

Each of the complementary structures 12 may include an oxide semiconductor layer. In an implementation, the oxide semiconductor layer may include, e.g., indium gallium zinc oxide (IGZO). In an implementation, the oxide semiconductor layer may include, e.g., indium tungsten oxide (IWO), indium tin gallium oxide (ITGO), indium aluminum zinc oxide (IAGO), indium gallium oxide (IGO), indium tin zinc oxide (ITZO), zinc tin oxide (ZTO), indium zinc oxide (IZO), ZnO, indium gallium silicon oxide (IGSO), indium oxide (InO), tin oxide (SnO), titanium oxide (TiO), zinc oxynitride (ZnON), magnesium zinc oxide (MgZnO), indium zinc oxide (InZnO), indium gallium zinc oxide (InGaZnO), zirconium indium zinc oxide (ZrInZnO), hafnium indium zinc oxide (HfInZnO), tin indium zinc oxide (SnInZnO), aluminum tin indium zinc oxide (AlSnInZnO)), silicon indium zinc oxide (SiInZnO), zinc tin oxide (ZnSnO), aluminum zinc tin oxide (AlZnSnO), gallium zinc tin oxide (GaZnSnO), zirconium zinc tin oxide (ZrZnSnO), or indium gallium silicon oxide (InGaSiO).

The semiconductor patterns 9 may be formed of a semiconductor material, and the oxide semiconductor layer of the complementary structures 12 may be formed of an oxide semiconductor material having an energy band gap greater than an energy band gap of the semiconductor material of the semiconductor patterns 9.

The oxide semiconductor layer of the complementary structures 12 may serve to remove charges trapped in the vertical channel regions 9CH of the semiconductor patterns 9 during the operation of the semiconductor device 1, and may have properties of an insulator capable of preventing leakage current between the semiconductor patterns 9 adjacent to each other, e.g., the first semiconductor pattern 9_1 and the second semiconductor pattern 9_2 or mutual interference between the first semiconductor pattern 9_1 and the second semiconductor pattern 9_2 under an operating condition of the semiconductor device 1.

The vertical channel regions 9CH may be a floating body, and the complementary structures 12 including the oxide semiconductor layer may be a structure complementing the floating vertical channel regions 9CH so as to help prevent or minimize performance degradation of the semiconductor device 1 caused by a floating body effect of the vertical channel regions 9CH. Accordingly, the complementary structures 12 may be a term used as a structure for complementing the vertical channel regions 9CH, and the complementary structures 12 may be described interchangeably with other terms. In an implementation, the complementary structures 12 may be described interchangeably with a term such as a first structure or an oxide semiconductor structure.

In an implementation, the oxide semiconductor layer of the complementary structures 12 may include an oxide semiconductor material including, e.g., about 40 at % or less of In or about 40 at % or more of Ga. In an implementation, the oxide semiconductor layer of the complementary structures 12 may include an indium gallium zinc oxide (IGZO) material, and the indium gallium zinc oxide (IGZO) material may include about 40 at % or less of In or about 40 at % or more of Ga.

In an implementation, the oxide semiconductor layer of the complementary structures 12 may include an oxide semiconductor material doped with an impurity so as to adjust an energy band gap. In an implementation, the oxide semiconductor layer of the complementary structures 12 may include an oxide semiconductor material doped with a group V element, e.g., "H" or "N", so as to adjust an energy band gap.

The complementary structures 12 may include first complementary structures 12_1 between the first semiconductor patterns 9_1 and the second semiconductor patterns 9_2, and second complementary structures 12_2 between the third semiconductor patterns 9_3 and the fourth semiconductor patterns 9_4.

The first complementary structures 12_1 may be spaced apart from each other in the first direction Y. The second complementary structures 12_2 may be spaced apart from each other in the first direction Y.

The structures 20 may further include isolation patterns 18. The isolation patterns 18 may be formed of an insulating material. The isolation patterns 18 may include first isolation patterns 18_1 and second isolation patterns 18_2. The first isolation patterns 18_1 may be between adjacent ones of the first semiconductor patterns 9_1 spaced apart from each other in the first direction Y, and between adjacent ones of the second semiconductor patterns 9_2 spaced apart from each other in the first direction Y. The first isolation patterns 18_1 may be between adjacent ones of the first complementary structures 12_1 spaced apart from each other in the first direction Y.

The second isolation patterns 18_2 may be between adjacent ones of the third semiconductor patterns 9_3 spaced apart from each other in the first direction Y, and between adjacent ones of the fourth semiconductor patterns 9_4 spaced apart from each other in the first direction Y. The second isolation patterns 18_2 may be between adjacent ones of the second complementary structures 12_2 spaced apart from each other in the first direction Y.

The first structure 20_1 may include the first and second semiconductor patterns 9_1 and 9_2, the first complementary structures 12_1, and the first isolation patterns 18_1. The second structure 20_2 may include the third and fourth semiconductor patterns 9_3 and 9_4, the second complementary structures 12_2, and the second isolation patterns 18_2.

The semiconductor device 1 may further include an intermediate insulating layer 30 between the structures 20. The intermediate insulating layer 30 may include, e.g., a silicon oxide or a low-x dielectric.

The semiconductor device 1 may further include conductive lines 27 between the structures 20. Each of the conductive lines 27 may extend in the first direction Y. The conductive lines 27 may be spaced apart from each other in the second direction X, and may be parallel to each other. The conductive lines 27 may be between the intermediate insulating layer 30 and the structures 20.

The conductive lines 27 may include a first conductive line 27_1 and a second conductive line 27_2 parallel to each other with the first structure 20_1 therebetween. The conductive lines 27 may include a third conductive line 27_3 and a fourth conductive line 27_4 parallel to each other with the second structure 20_2 therebetween. A pair of conductive lines, e.g., the second and third conductive lines 27_2 and 27_3 may be between the first and second structures 20_1 and 20_2 that are adjacent to each other in the second direction X.

At least a portion of each of the structures 20 may be between the conductive lines 27. In an implementation, at least a portion of the first structure 20_1 may be between the first and second conductive lines 27_1 and 27_2.

An upper surface (e.g., surface facing away from the substrate in the third direction Z) of each of the semiconductor patterns 9 may be on or at a level higher than that of an upper surface of each of the conductive lines 27. A lower surface (e.g., substrate-facing surface) of each of the semiconductor patterns 9 may be on or at a level lower than that of a lower surface of each of the conductive lines 27.

In an implementation, the conductive lines 27 may be gate electrodes. The conductive lines 27 may be word lines. In an implementation, the first and second conductive lines 27_1 and 27_2 may be referred to as first and second gate electrodes or first and second word lines.

The conductive lines 27 may include, e.g., doped polysilicon, a metal, a conductive metal nitride, a metal-semiconductor compound, a conductive metal oxide, a conductive graphene, carbon nanotubes, or a combination thereof. In an implementation, the conductive lines 27 may be formed of, e.g., doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrO$_x$, RuO$_x$, graphene, carbon nanotubes, or a combination thereof. The conductive lines 27 may include a single layer or multiple layers of the materials described above.

The semiconductor device 1 may further include gate dielectric layers 24 between the conductive lines 27 and the semiconductor patterns 9.

The gate dielectric layers 24 may include a first gate dielectric layer 24_1 including a portion between the first conductive line 27_1 and the first semiconductor pattern 9_1, a second gate dielectric layer 24_2 including a portion between the second conductive line 27_2 and the second semiconductor pattern 9_2, a third gate dielectric layer 24_3 including a portion between the third conductive line 27_3 and the third semiconductor pattern 9_3, and a fourth gate dielectric layer 24_4 including a portion between the fourth conductive line 27_4 and the fourth semiconductor pattern 9_4.

Between the structures 20 adjacent to each other, the gate dielectric layers 24 may be connected to each other. In an implementation, the gate dielectric layers 24 may include a horizontal connection portion 24_H extending from an upper region of the second gate dielectric layer 24_2 and an upper region of the third gate dielectric layer 24_3 between the first and second structures 20_1 and 20_2 to connect the second and third gate dielectric layers 24_2 and 24_3 to each other. The horizontal connection portion 24_H may be on the intermediate insulating layer 30.

The gate dielectric layers 24 may include, e.g., a silicon oxide or a high-K dielectric. The high-K dielectric may include, e.g., a metal oxide or a metal oxynitride. In an implementation, the high-K dielectric material may be formed of, e.g., HfO$_2$, HfSiO, HfSiON, HfTaO, HfSiO, HfZrO, ZrO$_2$, Al$_2$O$_3$, or a combination thereof. The gate dielectric layer may be formed of a single layer or multiple layers of the materials described above.

The semiconductor device 1 may further include a first lower insulating layer 33 below the structures 20 and the intermediate insulating layer 30, and a second lower insulating layer 45 below the first lower insulating layer 33. The first lower insulating layer 33 may be formed of an insulating material, e.g., a silicon oxide, a silicon nitride, a silicon oxynitride (SiON), or a silicon carbonitride (SiCN). The second lower insulating layer 45 may be formed of an insulating material, e.g., a silicon oxide, a silicon nitride, a silicon oxynitride (SiON), or a silicon carbonitride (SiCN).

The semiconductor device 1 may further include lower conductive lines 39 on or at a level lower than those of structures 20, and lower contact structures 36 between the lower conductive lines 39 and the semiconductor patterns 9. The lower conductive lines 39 and the lower contact structures 36 may be buried in the first and second lower insulating layers 33 and 45. In an implementation, the lower contact structures 36 may pass through the first lower insulating layer 33, and the lower conductive lines 39 may be below the first lower insulating layer 33. The second lower insulating layer 45 may cover lower surfaces and side surfaces of the lower conductive lines 39.

Each of the lower conductive lines 39 may have a line shape extending in the second direction X. The lower contact structures 36 may electrically connect the lower conductive lines 39 and the semiconductor patterns 9 to each other. In an implementation, the lower contact structures 36 may be in contact with and electrically connected to the first source/drain regions 9SD1 of the semiconductor patterns 9.

The lower conductive lines 39 may be bit lines.

At least one of the lower conductive lines 39 and the lower contact structures 36 may include doped polysilicon, a metal, a conductive metal nitride, a metal-semiconductor compound, a conductive metal oxide, conductive graphene, carbon nanotubes, or a combination thereof. In an implementation, at least one of the lower conductive lines 39 and the lower contact structures 36 may be formed of, e.g., doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrO$_x$, RuO$_x$, graphene, carbon nanotubes, or a combination thereof. At least one of the lower conductive lines 39 and the lower contact structures 36 may include a single layer or multiple layers of the materials described above.

The semiconductor device 1 may further include shielding conductive lines 42 alternately and repeatedly arranged with the lower conductive lines 39. The shielding conductive lines 42 may be on a level the same as those of the lower conductive lines 39, and may be formed of a material the same as those of the lower conductive lines 39.

The semiconductor device 1 may further include an upper insulating layer 50 on the structures 20 and the intermediate insulating layer 30.

The semiconductor device 1 may further include upper contact structures 53 electrically connected to the semiconductor patterns 9. The upper insulating layer 50 may cover side surfaces of the upper contact structures 53.

Each of the upper contact structures 53 may include a plug portion 55 and a pad portion 57 on the plug portion 55. The plug portions 55 of the upper contact structures 532 may be in contact (e.g., direct contact) with and electrically connected to the second source/drain regions 9SD2 of the semiconductor patterns 9.

At least one of the plug portion 55 and the pad portion 57 may be formed of, e.g., doped polysilicon, a metal, a conductive metal nitride, a metal-semiconductor compound, a conductive metal oxide, conductive graphene, carbon nanotubes, or a combination thereof. In an implementation, at least one of the plug portion 55 and the pad portion 57 may be formed of, e.g., doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrO$_x$, RuO$_x$, graphene, carbon nanotubes, or a combination thereof. At least one of the plug portion 55 and the pad portion 57 may include a single layer or multiple layers of the materials described above.

The semiconductor device 1 may further include a data storage structure 60. The data storage structure 60 may include first electrodes 62 electrically connected to the upper contact structures 53, a second electrode 66 covering the first electrodes 62, and a dielectric layer 64 between the first electrodes 62 and the second electrode 66.

In an implementation, the data storage structure 60 may be a capacitor for storing information in a DRAM. In an implementation, the dielectric layer 64 of the data storage structure 60 may be a capacitor dielectric layer of a DRAM, and the dielectric layer 64 may include, e.g., a high-K dielectric, a silicon oxide, a silicon nitride, a silicon oxynitride, or a combination thereof.

In an implementation, the data storage structure 60 may be a structure for storing information on a memory different from a DRAM (Dynamic Random Access Memory). In an implementation, the data storage structure 60 may be a capacitor of a ferroelectric RAM (FeRAM) including a dielectric layer 64 between the first and second electrodes 62 and 66, the dielectric layer 64 including a ferroelectric layer. In an implementation, the dielectric layer 64 may be a ferroelectric layer capable of recording data using a polarization state. In an implementation, the dielectric layer 64 may include a lower dielectric layer and a ferroelectric layer on the lower dielectric layer. In an implementation, the lower dielectric layer may include, e.g., a silicon oxide, a silicon oxynitride, a silicon nitride, or a high-K dielectric. The high-K dielectric may include, e.g., a metal oxide or a metal oxynitride. In an implementation, the high-K dielectric material may be formed of, e.g., HfO$_2$, HfSiO, HfSiON, HfTaO, HfTiO, HfZrO, ZrO$_2$, Al$_2$O$_3$, or a combination thereof.

When the data storage structure 60 is a capacitor for storing information on a ferroelectric memory (FeRAM), the ferroelectric layer of the dielectric layer 64 may include, e.g., an Hf-containing compound, a Zr-containing compound, or an Hf—Zr-containing compound. In an implementation, the Hf-containing compound may be an HfO-containing ferroelectric material, the Zr-containing compound may include a ZrO-containing ferroelectric material, and the Hf—Zr-containing compound may include a hafnium zirconium oxide (HZO)-containing ferroelectric material. The ferroelectric layer of the dielectric layer 64 of the data storage structure 60 may include a ferroelectric material doped with an impurity, e.g., C, Si, Mg, Al, Y, N, Ge, Sn, Gd, La, Sc, or Sr. In an implementation, the ferroelectric layer of the dielectric layer 64 of the data storage structure 60 may be a material in which HfO$_2$, ZrO$_2$, or HZO is doped with an impurity, e.g., C, Si, Mg, Al, Y, N, Ge, Sn, Gd, La, Sc, or Sr. In an implementation, the ferroelectric layer of the dielectric layer 64 of the data storage structure 60 may include a material having ferroelectric properties capable of storing information. In an implementation, the ferroelectric layer of the dielectric layer 64 of the data storage structure 60 may include, e.g., BaTiO$_3$, PbTiO$_3$, BiFeO$_3$, SrTiO$_3$, PbMgNdO$_3$, PbMgNb-TiO$_3$, PbZrNbTiO$_3$, PbZrTiO$_3$, KNbO$_3$, LiNbO$_3$, GeTe, LiTaO$_3$, KNaNbO$_3$, BaSrTiO$_3$, HF$_{0.5}$Zr$_{0.5}$O$_2$, PbZr$_x$T$_{1-x}$O$_3$ (in which 0<x<1), Ba(Sr, Ti)O$_3$, Bi$_{4-x}$La$_x$Ti$_3$O$_{12}$ (in which 0<x<1), SrBi$_2$Ta$_2$O$_9$, Pb$_5$Ge$_5$O$_{11}$, SrBi$_2$Nb$_2$O$_9$, or YMnO$_3$ In an implementation, the first conductive line 27_1, e.g., the first gate electrode, may face a first side surface 9s1 of the first semiconductor pattern 9_1, and the first complementary structure 12_1 may be in contact with a second side surface 9s2 of the first semiconductor pattern 9_1. The first gate dielectric layer 24_1 may include a portion between the first semiconductor pattern 9_1 and the first gate electrode 27_1. The first and second side surfaces 9s1 and 9s2 of the first semiconductor pattern 9_1 may oppose each other.

In an implementation, the semiconductor device 1 may include semiconductor patterns 9 formed of a single crystal semiconductor having excellent charge mobility and on-current properties, and complementary structures 12 including an oxide semiconductor layer capable of complementing the semiconductor patterns 9. In an implementation, each of the semiconductor patterns 9 may include a vertical channel region 9CH of a transistor, and the complementary structures 12 may include an oxide semiconductor layer capable of removing charges trapped in the vertical channel regions 9CH of the semiconductor patterns 9. In an implementation, during repeated on-off operations of transistors including the conductive lines, e.g., the gate electrodes 27, the gate dielectric layers 24, the first and second source/drain regions 9SD1 and 9SD2, and the vertical channel regions 9CH, the charges may be trapped in the vertical channel region 9CH to be accumulated, and the complementary structures 12 including the oxide semiconductor layer may help prevent occurrence of defects in the semiconductor device by the charges accumulated in the vertical channel region 9CH. In an implementation, the charges that may be accumulated in the vertical channel regions 9CH may be holes, and the holes that may be trapped in the vertical channel regions 9CH as described above may be diffused into the oxide semiconductor layer of the complementary structures 12, such that the oxide semiconductor layer of the complementary structures 12 may help prevent the holes from being accumulated in the vertical channel regions 9CH.

The oxide semiconductor layer of the complementary structures 12 may serve to help remove the charges trapped in the vertical channel regions 9CH of the semiconductor patterns 9 during operation of the semiconductor device 1, and may have properties of an insulator capable of preventing leakage current between the semiconductor patterns 9 adjacent to each other under an operating condition of the semiconductor device 1. In an implementation, the complementary structures 12 including the oxide semiconductor layer may be provided, thereby preventing the performance of the semiconductor device 1 from being degraded due to a floating body effect in the vertical channel regions 9CH of the semiconductor patterns 9 while minimizing mutual interference between the semiconductor patterns 9.

Hereinafter, various modifications of elements of the above-described example embodiment will be described with reference to FIGS. 3 to 12B. The various modifications of the elements of the above-described example embodiment described below will be mainly described with respect to elements to be modified or elements to be replaced. In addition, the elements that are modifiable or replaceable to be described below are described with reference to drawings below, but the elements that are modifiable or replaceable are combined with each other, or are combined with the elements described above to configure a semiconductor device according to example embodiments.

Figure 3:
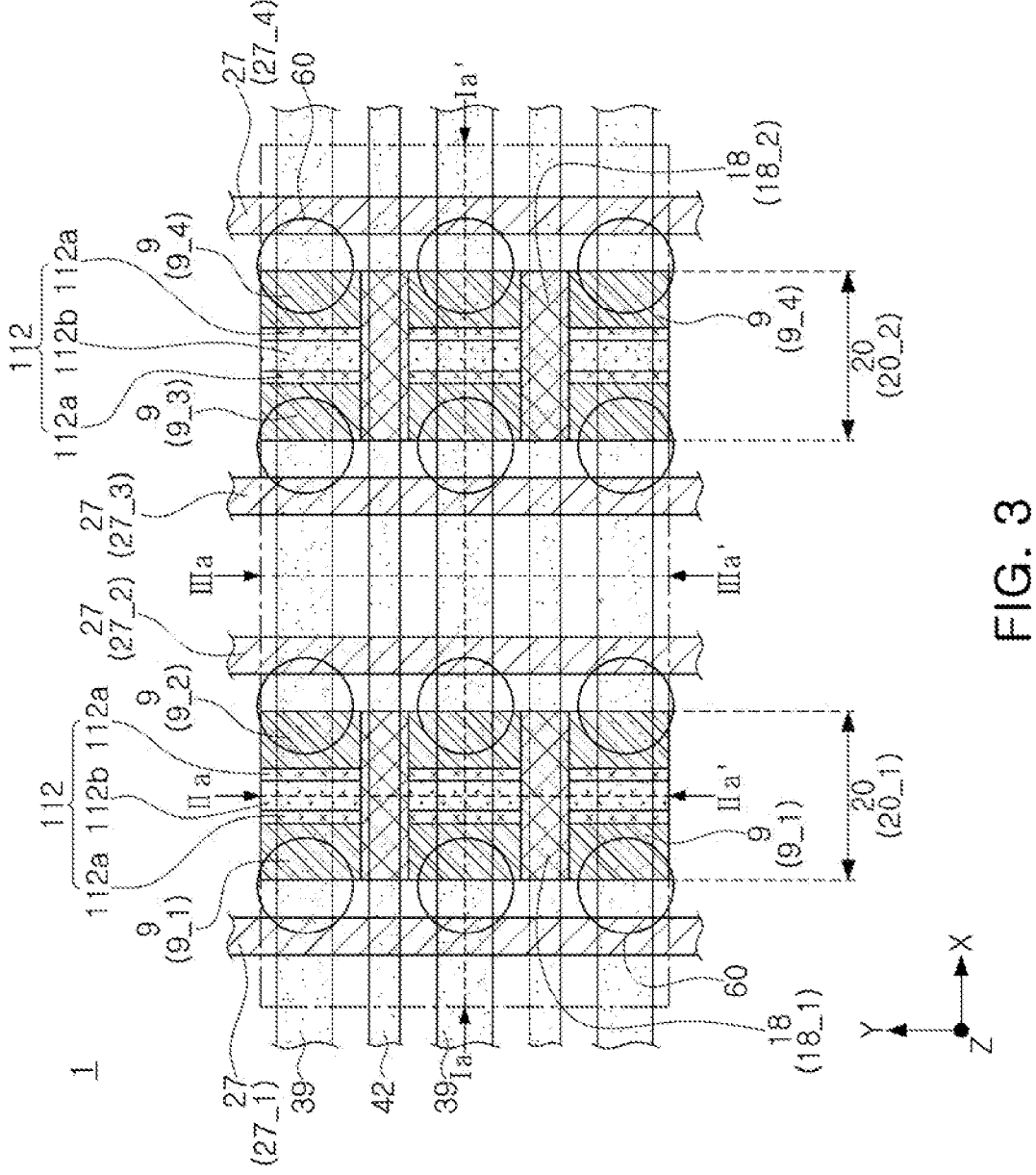
FIGS. 3, 4A, and 4B are schematic diagrams illustrating a modification of a semiconductor device according to an example embodiment.
Figure 4A:
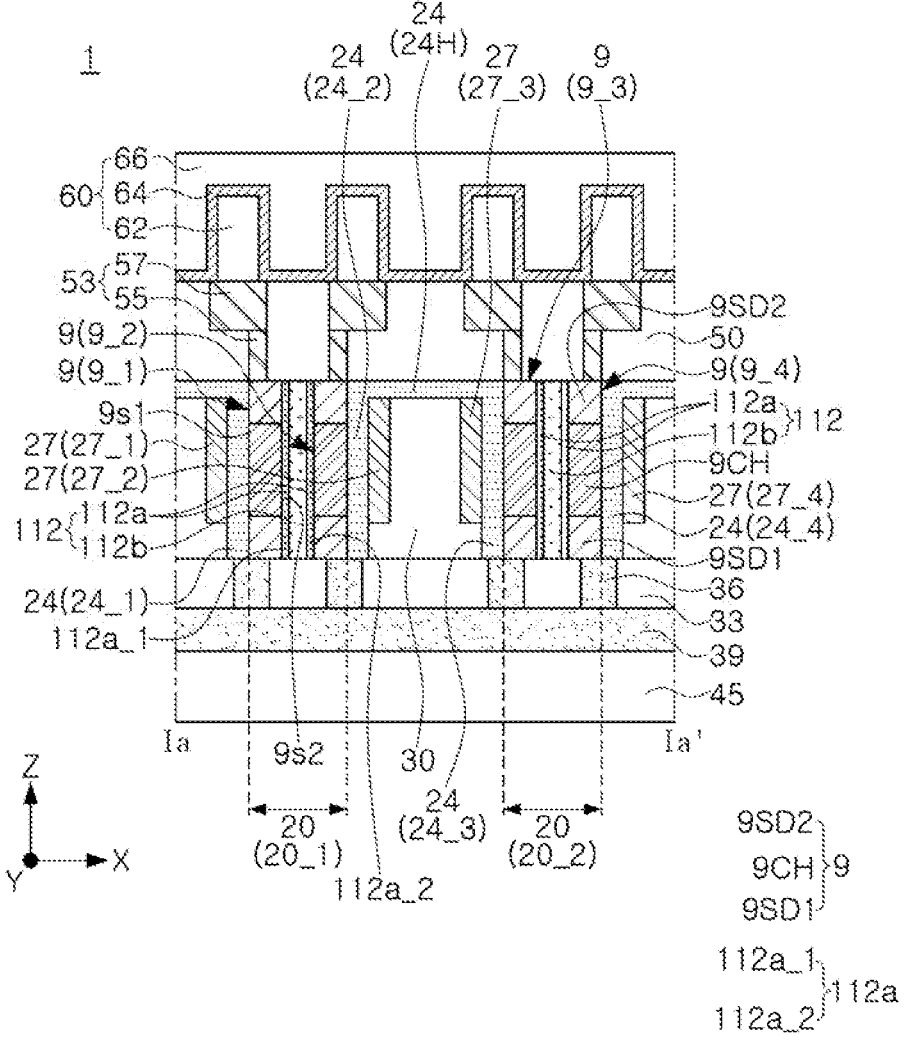
Figure 4B:
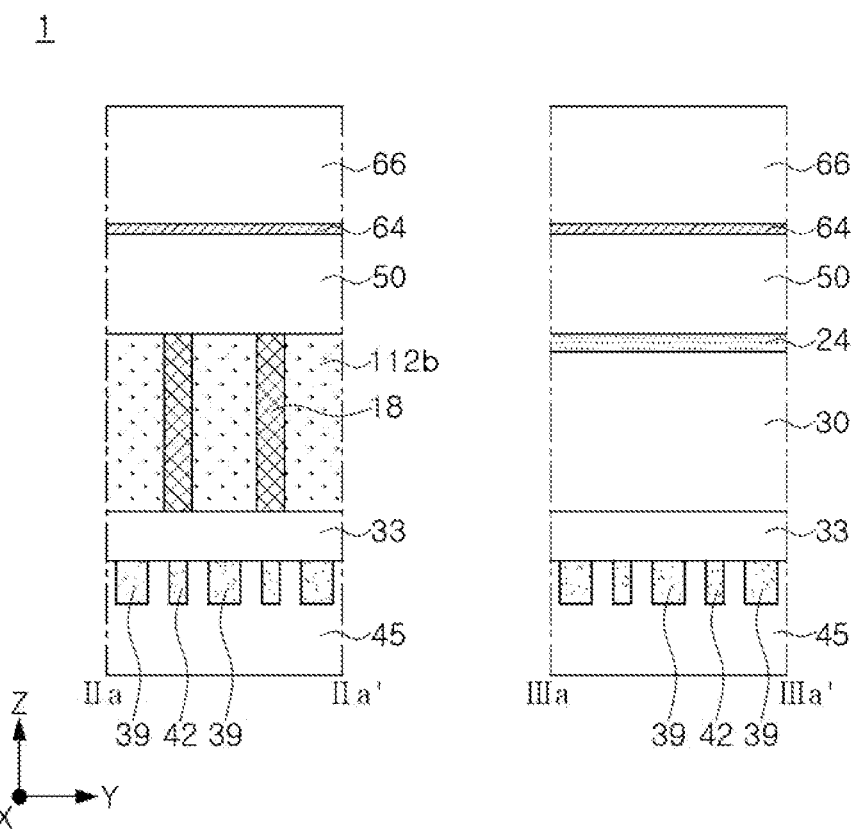

FIGS. 3, 4A, and 4B are schematic diagrams illustrating a modification of a semiconductor device according to an example embodiment. FIG. 3 is a schematic top view illustrating a modification of a semiconductor device according to an example embodiment. FIG. 4A is a schematic cross-sectional view illustrating a region taken along line Ia-Ia' of FIG. 3. FIG. 4B is a schematic cross-sectional view illustrating regions taken along line IIa-IIa' and line IIIa-IIIa' of FIG. 3

In a modification, referring to FIGS. 3, 4A and 4B, in the semiconductor device 1, the complementary structures 12 of FIGS. 1, 2A and 2B may instead be complementary structures 112 illustrated in FIGS. 3, 4A and 4B.

Each of the complementary structures 112 may include first layers 112a and a second layer 112b between the first layers 112a. The first layers 112a may be in contact with the semiconductor patterns 9.

In an implementation, the oxide semiconductor layer of each of the complementary structures 112 may include at least two layers 112a and 112b having different energy band gaps. In an implementation, the first layers 112a may include a first oxide semiconductor layer having an energy band gap greater than an energy band gap of a semiconductor material of the semiconductor patterns 9, and the second layer 112b may include a second oxide semiconductor layer different from the first oxide semiconductor layer. In an implementation, the second oxide semiconductor layer may have an energy band gap greater than that of the first oxide semiconductor layer. The first layers 112a may be in contact with the semiconductor patterns 9, and may help remove charges trapped in the vertical channel regions 9CH of the semiconductor patterns 9. The second layer 112b may have an energy band gap greater than that of the first oxide semiconductor layer, and may have properties of an insulator capable of preventing leakage current between the semiconductor patterns 9 adjacent to each other under an operating condition of the semiconductor device 1.

In an implementation, the first layers 112a may be an oxide semiconductor layer, and the second layer 112b may be an insulating layer. The second layer 112b may be an insulating layer in contact with oxide semiconductor layers of the first layers 112a. The second layer 112b may be an insulator capable of preventing leakage current between the semiconductor patterns 9 adjacent to each other. The second layer 112b may be an insulating layer such as a silicon oxide or a low-κ dielectric. The first layers 112a, which may be oxide semiconductor layers, may include a first oxide semiconductor portion 112a_1 between the first single crystal semiconductor pattern 9_1 and the insulating layer 112b, and a second oxide semiconductor portion 112a_2 between the second single crystal semiconductor pattern 9_2 and the insulating layer 112b.

Figure 5:
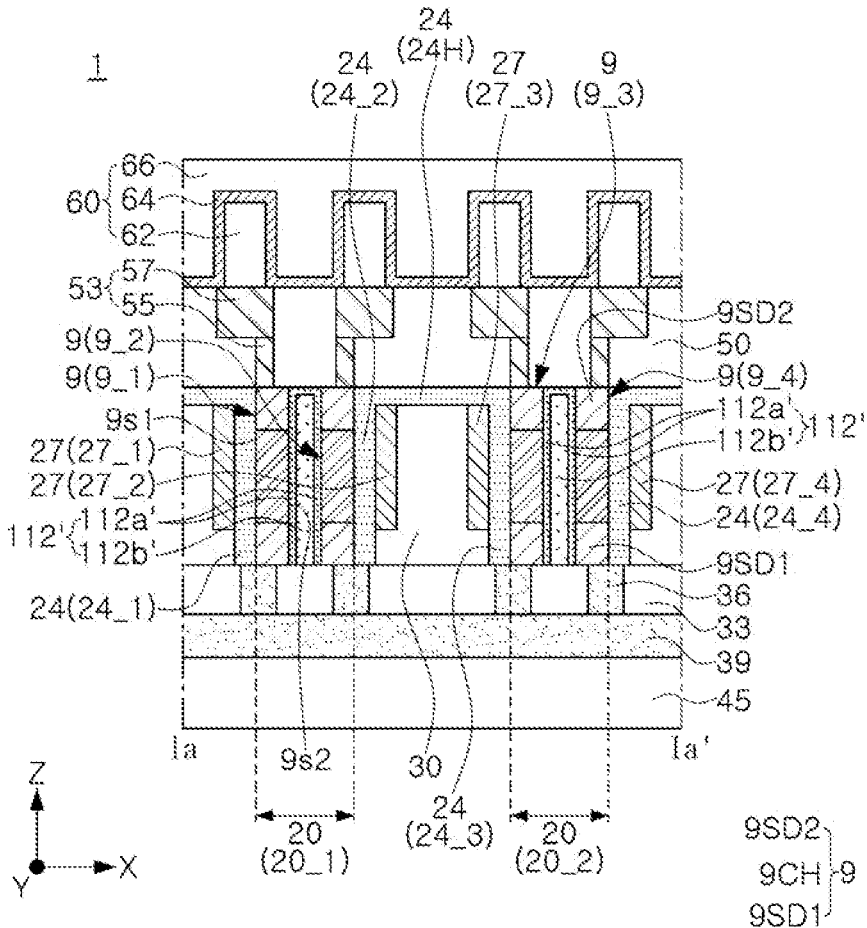
FIG. 5 is a schematic cross-sectional view illustrating a modification of a semiconductor device according to an example embodiment.

FIG. 5 is a schematic cross-sectional view illustrating a region taken along line Ia-Ia' of FIG. 3 so as to describe a modification of a semiconductor device according to an example embodiment.

In a modification, referring to FIG. 5, in the semiconductor device 1, the complementary structures 112 in FIGS. 3, 4A and 4B may instead be complementary structures 112' illustrated in FIG. 5.

Each of the complementary structures 112' may include a second layer 112b', and a first layer 112a' covering side surfaces and an upper surface of the second layer 112b'. The first layer 112a' may be in contact with the semiconductor patterns 9.

In the complementary structures 112', the first layer 112a' may be formed of a material the same as those of the first layers 112a in FIGS. 3, 4A and 4B, and the second layer 112b' may be formed of a material the same as that of the second layer 112b in FIGS. 3, 4A, and 4B.

Figure 6:
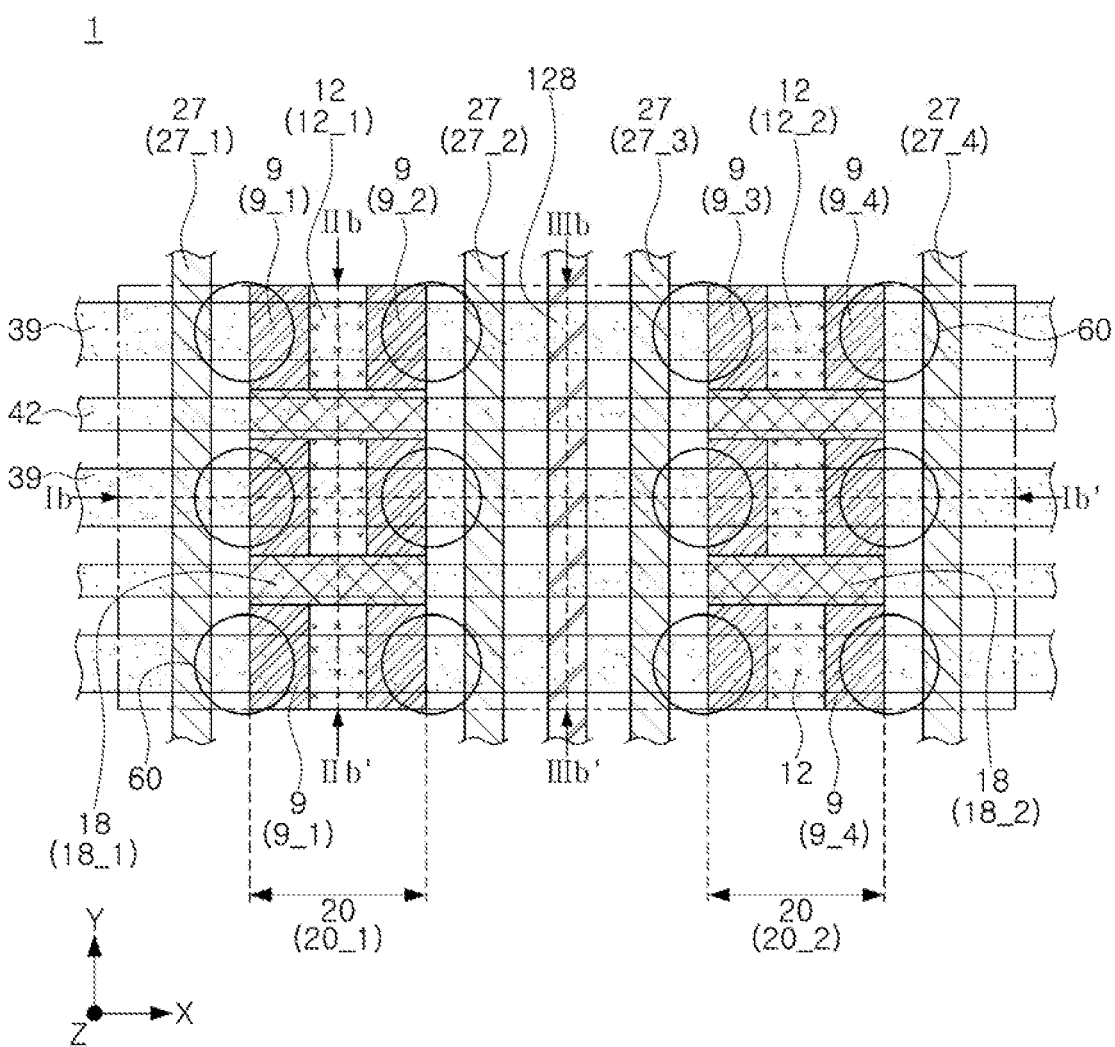
FIGS. 6, 7A, and 7B are schematic diagrams illustrating a modification of a semiconductor device according to an example embodiment.
Figure 7A:
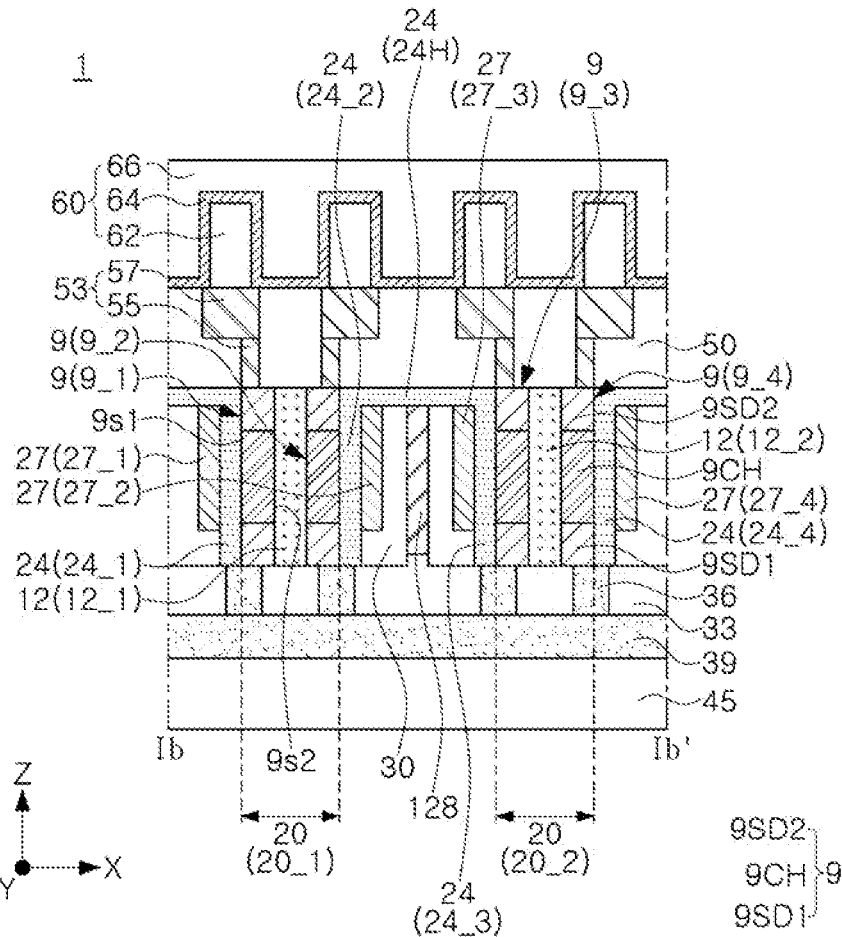
Figure 7B:
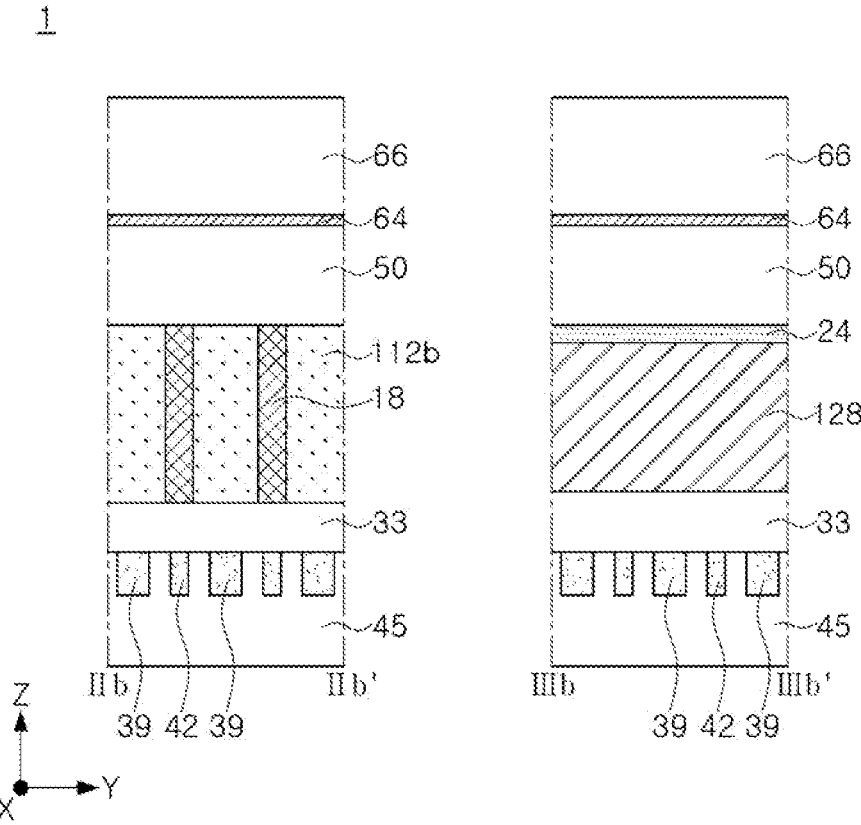

FIGS. 6, 7A, and 7B are schematic diagrams illustrating a modification of a semiconductor device according to an example embodiment. FIG. 6 is a schematic top view illustrating a modification of a semiconductor device according to an example embodiment. FIG. 7A is a schematic cross-sectional view illustrating a region taken along line Ib-Ib' of FIG. 6. FIG. 7B is a schematic cross-sectional view illustrating regions taken along line IIb-IIb' and line IIIb-IIIb' of FIG. 6.

In a modification, referring to FIGS. 6, 7A and 7B, the semiconductor device 1 may further include an intermediate shielding conductive line 128 between the conductive lines 27 adjacent to each other, e.g., between the structures 20 adjacent to each other.

The intermediate shielding conductive line 128 may be buried in the intermediate insulating layer 30 or may pass through the intermediate insulating layer 30. The intermediate shielding conductive line 128 may have a line shape extending in the first direction Y.

The intermediate shielding conductive line 128 may include doped polysilicon, a metal, a conductive metal nitride, a metal-semiconductor compound, a conductive metal oxide, conductive graphene, carbon nanotubes, or a combination thereof. In an implementation, the intermediate shielding conductive line 128 may be formed of, e.g., doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrO$_x$, RuO$_x$, graphene, carbon nanotubes, or a combination thereof. The intermediate shielding conductive line 128 may include a single layer or multiple layers of the materials described above.

The intermediate shielding conductive line 128 may help screen capacitive coupling between the conductive lines 27 adjacent to each other, e.g., the second and third conductive lines 27_2 and 27_3. In an implementation, the intermediate shielding conductive line 128 may help reduce or block parasitic capacitance between the conductive lines 27 adjacent to each other, thereby minimizing an RC delay in the conductive lines 27.

Figure 8A:
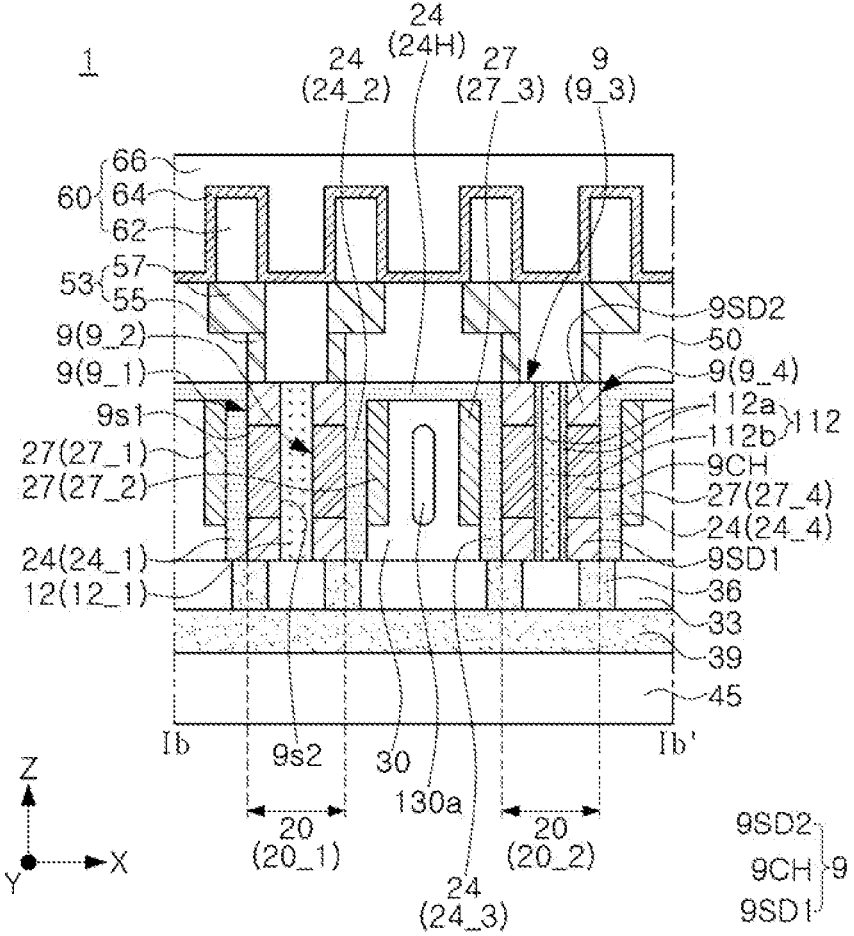
FIGS. 8A and 8B are schematic diagrams illustrating a modification of a semiconductor device according to an example embodiment.
Figure 8B:
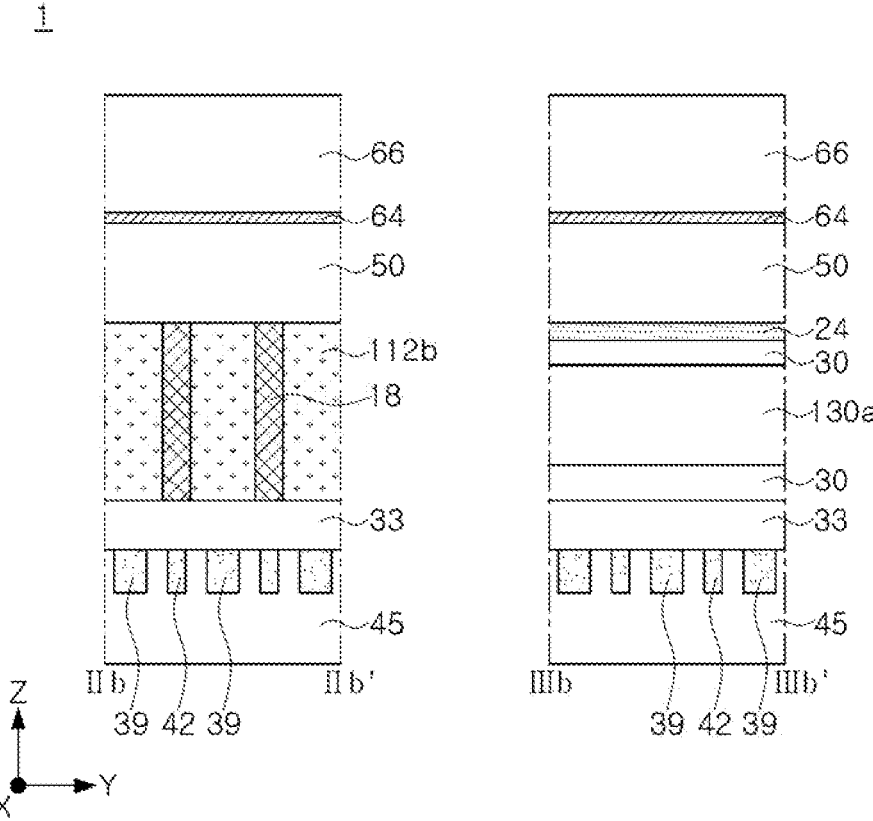

FIGS. 8A and 8B are schematic diagrams illustrating a modification of a semiconductor device according to an example embodiment. FIG. 8A is a schematic cross-sectional view illustrating a region taken along line Ib-Ib' of FIG. 6. FIG. 8B is a schematic cross-sectional view illustrating regions taken along lines IIb-IIb' and IIIb-IIIb' of FIG. 6.

In a modification, referring to FIGS. 8A and 8B, the semiconductor device 1 may further include an air gap 130*a* between the conductive lines 27 adjacent to each other, e.g., between the structures 20 adjacent to each other. The air gap 130*a* may be in the intermediate insulating layer 30. The air gap 130*a* may have a line shape extending in the first direction Y.

In an implementation, the semiconductor device 1 may include the air gap (130*a* in FIGS. 8A and 8B) and the intermediate shielding conductive line (128 in FIGS. 7A and 7B), and may not include the other.

The air gap 130*a* may help reduce parasitic capacitance between the conductive lines 27 adjacent to each other, e.g., the second and third conductive lines 27_2 and 27_3, thereby minimizing an RC delay in the conductive lines 27.

Figure 9:
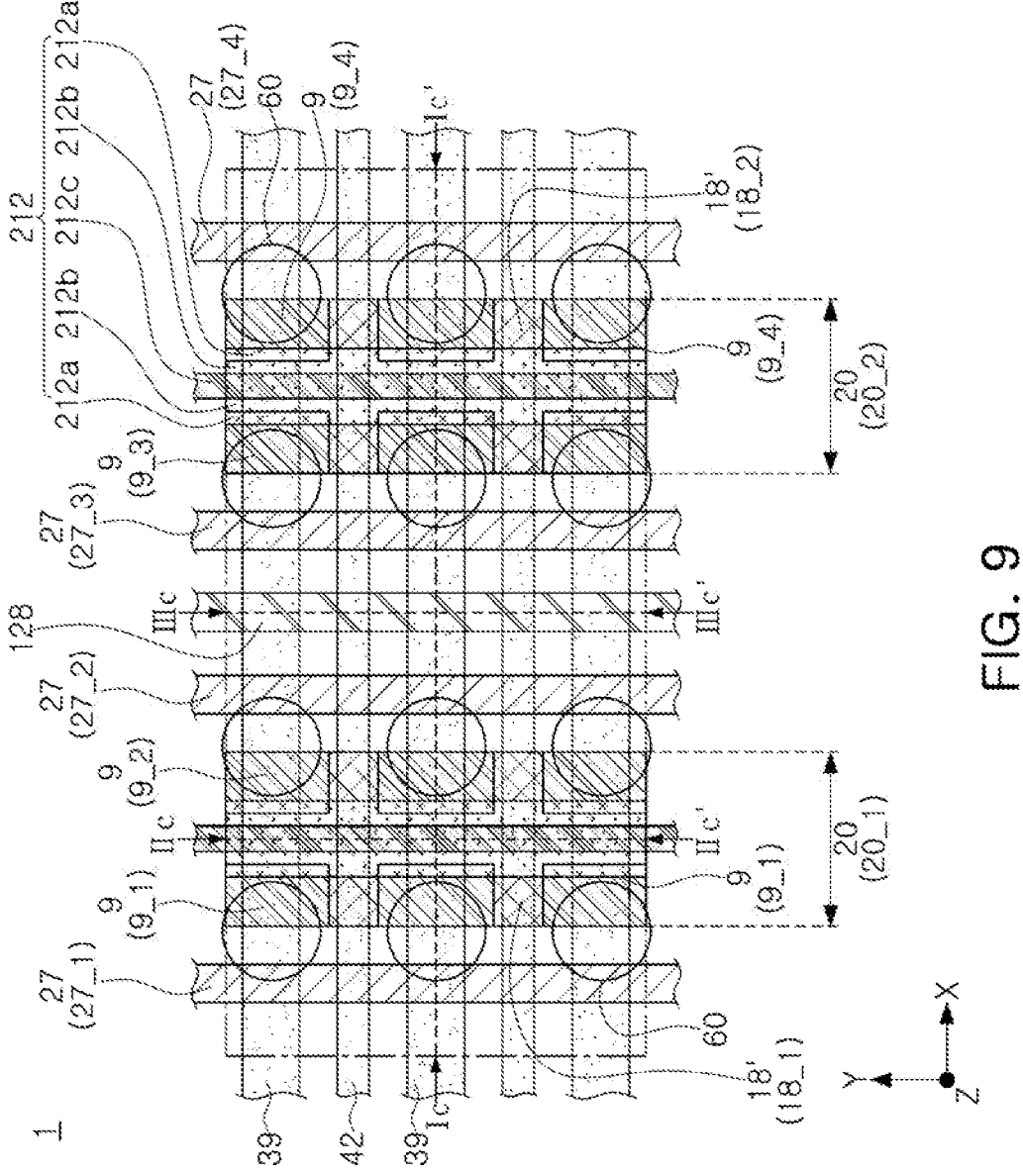
FIGS. 9, 10A, and 10B are schematic diagrams illustrating a modification of a semiconductor device according to an example embodiment.
Figure 10A:
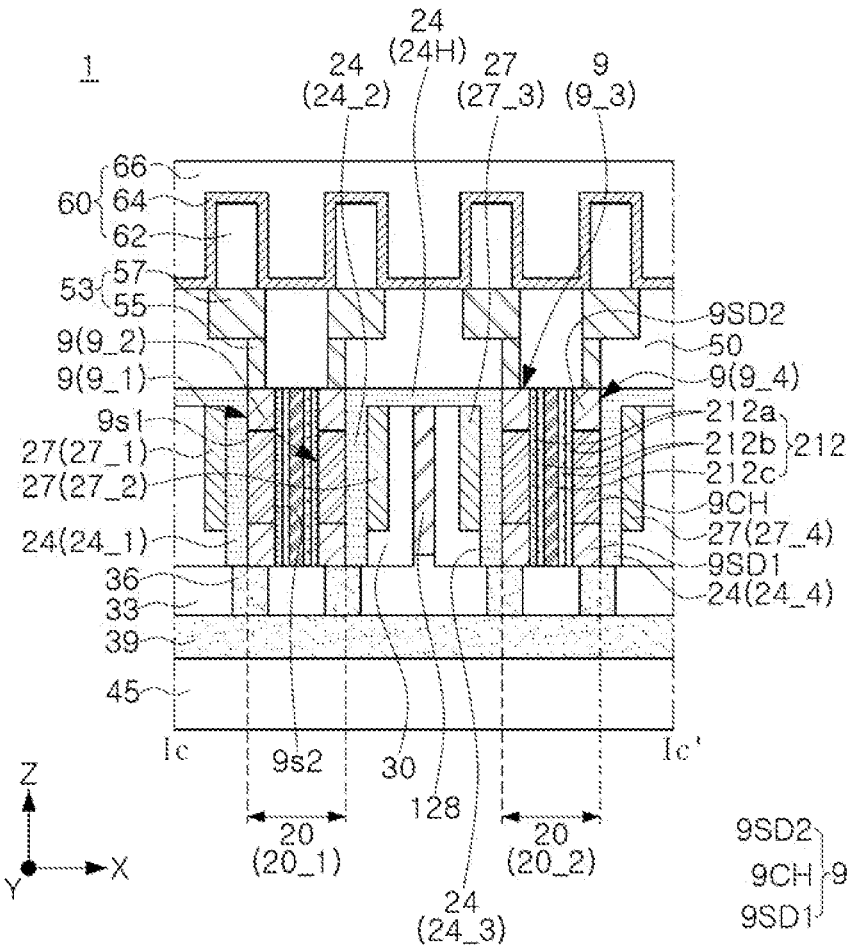
Figure 10B:
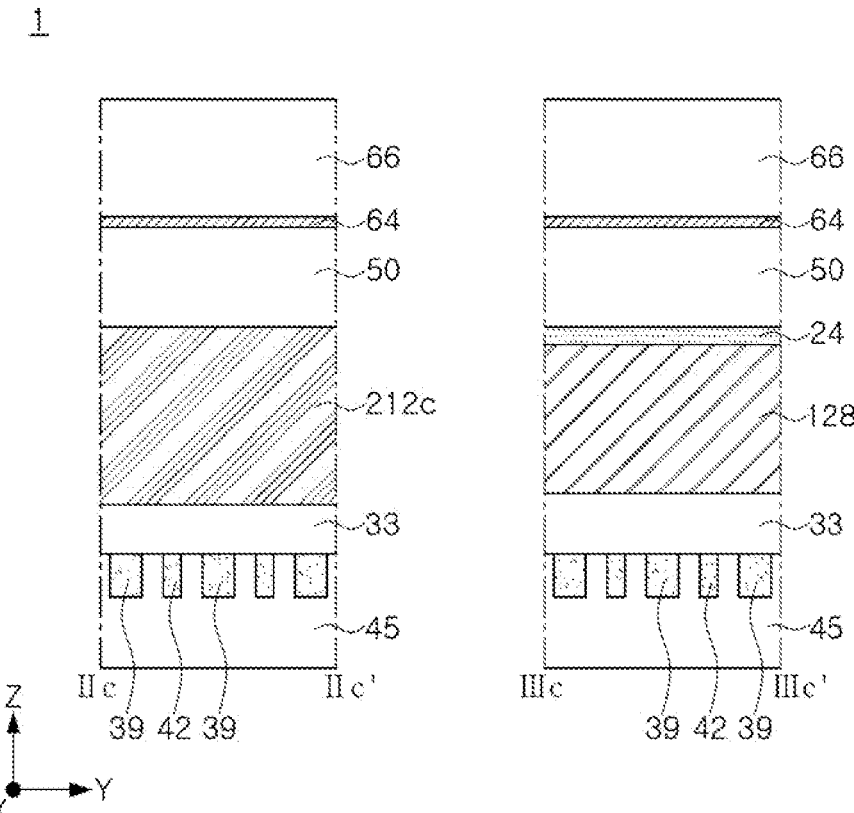

FIGS. 9, 10A, and 10B are schematic diagrams illustrating a modification of a semiconductor device according to an example embodiment. FIG. 9 is a schematic top view illustrating a modification of a semiconductor device according to an example embodiment. FIG. 10A is a schematic cross-sectional view illustrating a region taken along line Ic-Ic' of FIG. 9. FIG. 10B is a schematic cross-sectional view illustrating regions taken along line IIc-IIc' and line IIIc-IIIc' of FIG. 9.

In a modification, referring to FIGS. 9, 10A and 10B, in the semiconductor device 1, the complementary structures 12 in FIGS. 1, 2A and 2B may instead be complementary structures 212 illustrated in FIGS. 9, 10A and 10B. Each of the complementary structures 212 may include first layers 212*a*, second layers 212*b*, and a third layer 212*c*.

In a top view, each of the complementary structures 212 may extend in the first direction Y and pass through the isolation patterns 18'. Accordingly, the isolation patterns 18' may be isolated from each other in the second direction X by the complementary structures 212.

The second layers 212*b* and the third layer 212*c* may extend in the first direction Y and pass through the isolation patterns 18'. The first layers 212*a* may be between the second layers 212*b* and the semiconductor patterns 9.

The first layers 212*a* may be in contact with the semiconductor patterns 9.

The first layers 212*a* may be oxide semiconductor layers. The second layers 212*b* may be insulating material layers.

The third layer 212*c* may include doped polysilicon, a metal, a conductive metal nitride, a metal-semiconductor compound, a conductive metal oxide, conductive graphene, carbon nanotubes, or a combination thereof. In an implementation, the third layer 212*c* may be formed of, e.g., doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrO$_x$, RuO$_x$, graphene, carbon nanotubes, or a combination thereof. The third layer 212*c* may include a single layer or multiple layers of the materials described above.

The third layer 212*c* may be a shielding conductive line extending in the first direction Y. Accordingly, the third layer 212*c* may be referred to as a shielding conductive line.

The third layer 212*c*, which may be a shielding conductive line, may be spaced apart from the first layers 212*a*, which may be oxide semiconductor layers, by the second layers 212*b*, which may be insulating layers.

The third layer 212*c* may be between the semiconductor patterns 9. The third layer 212*c* may help minimize or prevent mutual interference between the semiconductor patterns 9 adjacent to each other, e.g., the first and second semiconductor patterns 9_1 and 9_2. Accordingly, the third layer 212*c* may prevent the performance of the semiconductor device 1 from being degraded due to mutual interference between the semiconductor patterns 9 adjacent to each other.

When the semiconductor device 1 includes the intermediate shielding conductive line 128 described with reference to FIGS. 6, 7A and 7B, the intermediate shielding conductive line 128 may be referred to as a first intermediate shielding conductive line, and the third layer 212*c* may be referred to as a second intermediate shielding conductive line.

Figure 11:
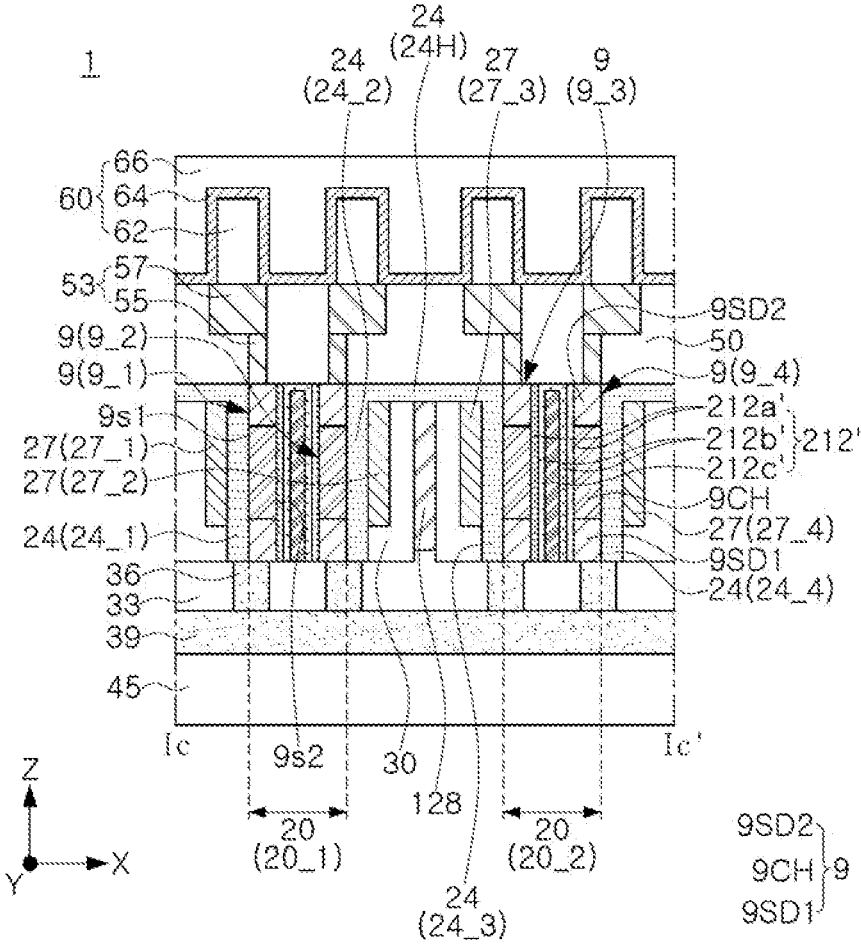
FIG. 11 is a schematic cross-sectional view illustrating a modification of a semiconductor device according to an example embodiment.

FIG. 11 is a schematic cross-sectional view illustrating a region taken along line Ic-Ic' of FIG. 9 so as to describe a modification of a semiconductor device according to an example embodiment.

In a modification, referring to FIG. 11, in the semiconductor device 1, the complementary structures 212 in FIGS. 10A and 10B may instead be complementary structures 212' illustrated in FIG. 11.

Each of the complementary structures 212' may include a first layer 212*a*', a second layer 212*b*', and a third layer 212*c*'. The second layer 212*b*' and the third layer 212*c*' may extend in the first direction Y and pass through the isolation patterns 18. The first layers 212*a*' may be between the second layer 212*b*' and the semiconductor patterns 9.

The first layers 212*a*' may be in contact with the semiconductor patterns 9. The second layer 212*b*' may cover side surfaces and an upper surface of the third layer 212*c*'.

In the complementary structures 212', the first layer 212*a*' may be formed of a material the same as those of the first layers 212*a* in FIGS. 10A and 10B, the second layer 212*b*' may be formed of a material the same as those of the second layers 212*b* in FIGS. 10A and 10B, and the third layer 212*c*' may be formed of a material the same as that of the third layer 212*c* in FIGS. 10A and 10B, and may play a role substantially the same as that of the third layer 212*c* in FIGS. 10A and 10B.

Figure 12:
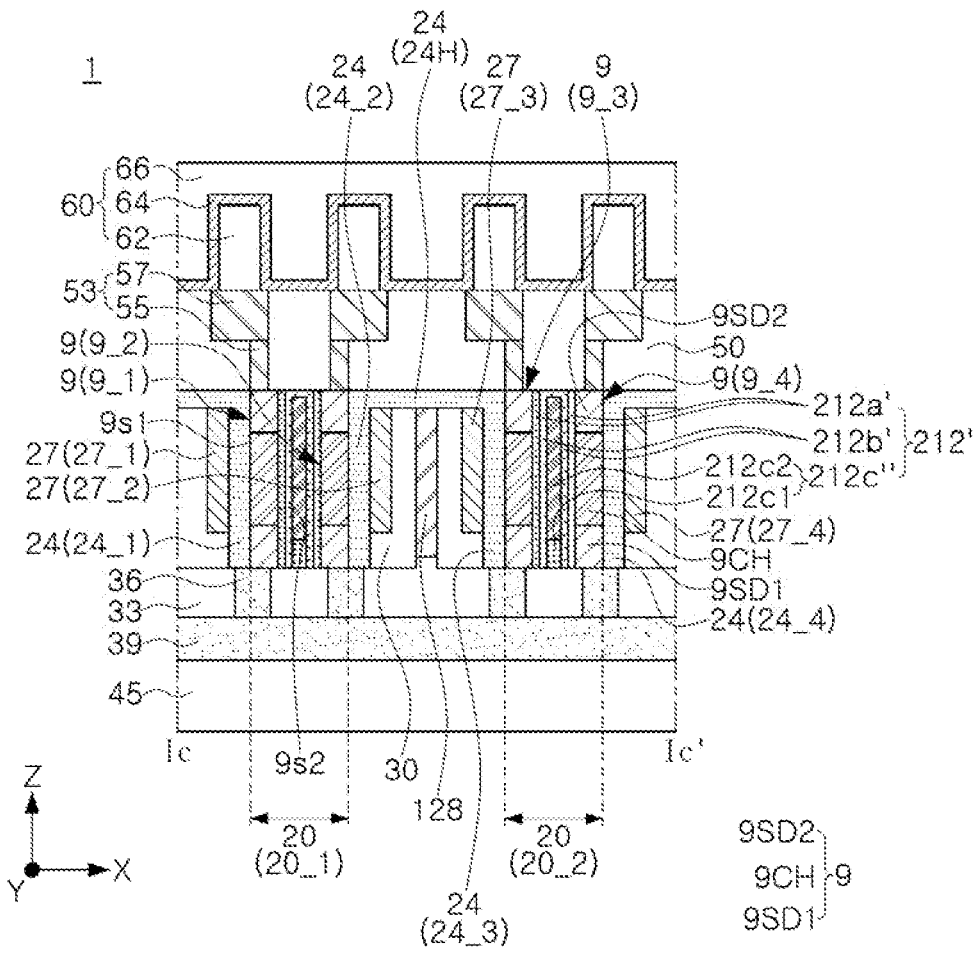
FIG. 12 is a schematic cross-sectional view illustrating a modification of a semiconductor device according to an example embodiment.

FIG. 12 is a schematic cross-sectional view illustrating a region taken along line Ic-Ic' of FIG. 9 so as to describe a modification of a semiconductor device according to an example embodiment.

In a modification, referring to FIG. 12, in the complementary structures 212' in FIG. 11, the third layer 212*c*' may instead be a third layer 212*c*" illustrated in FIG. 12.

The third layer 212*c*" may include a lower portion 212*c*1 and an upper portion 212*c*2 on the lower portion 212*c*1. The lower portion 212*c*1 may be formed of an insulating material. The upper portion 212*c*2 may be formed of a conductive material. The upper portion 212*c*2 of the third layer 212*c*" may be formed of a material the same as that of the third layer 212*c* in FIGS. 10A and 10B, and may play a role substantially the same as that of the third layer 212*c* in FIGS. 10A and 10B.

Next, an example of a method of forming a semiconductor device according to an example embodiment will be described with reference to FIG. 1 and FIGS. 13 to 23B. In FIGS. 13 to 23B, FIGS. 13, 16, 18, and 21 are top views illustrating an example of a method of forming a semiconductor device according to an example embodiment. FIGS. 14A, 15A, 17A, 19A, 20A, 22A, and 23A are cross-sectional views illustrating a region taken along line I-I' of FIG. 1. FIGS. 14B, 15B, 17B, 19B, 20B, 22B, and 23B are cross-sectional views illustrating regions taken along line and line of FIG. 1.

Figure 13:
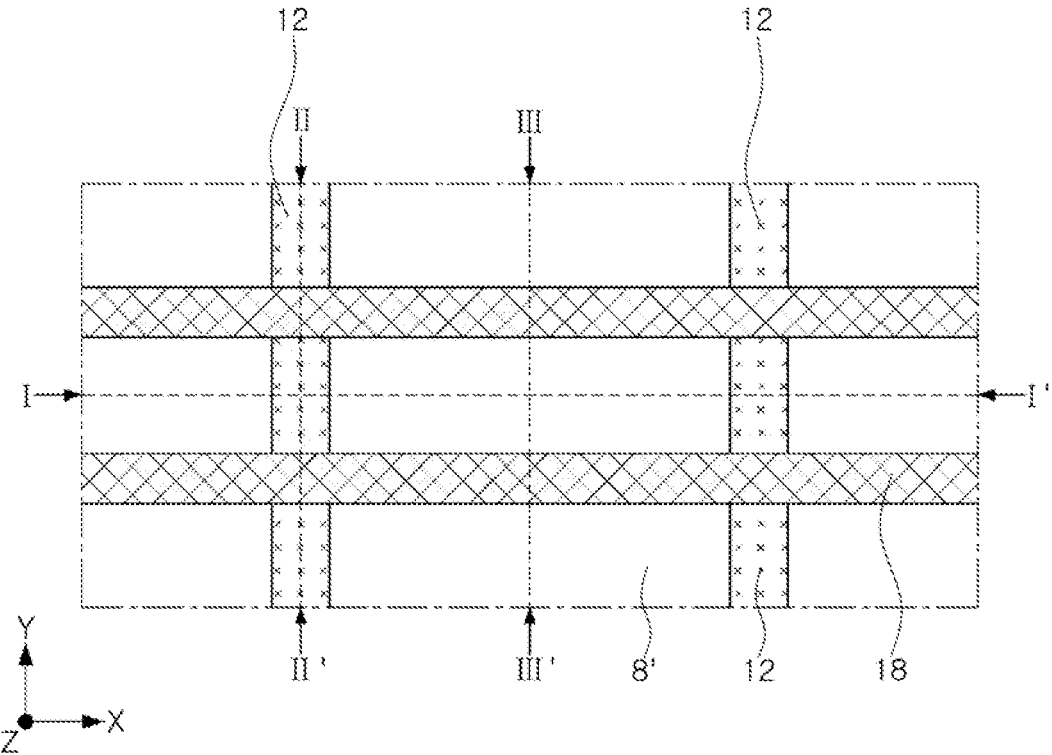
FIGS. 13 to 23B are schematic diagrams of stages in a method of forming a semiconductor device according to an example embodiment.
Figure 14A:
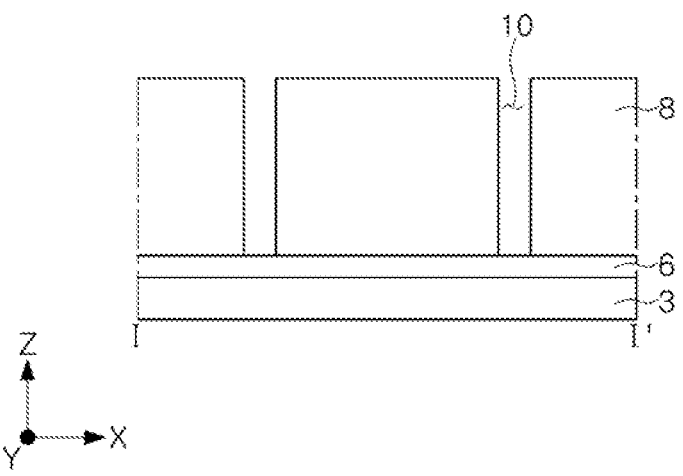
Figure 14B:
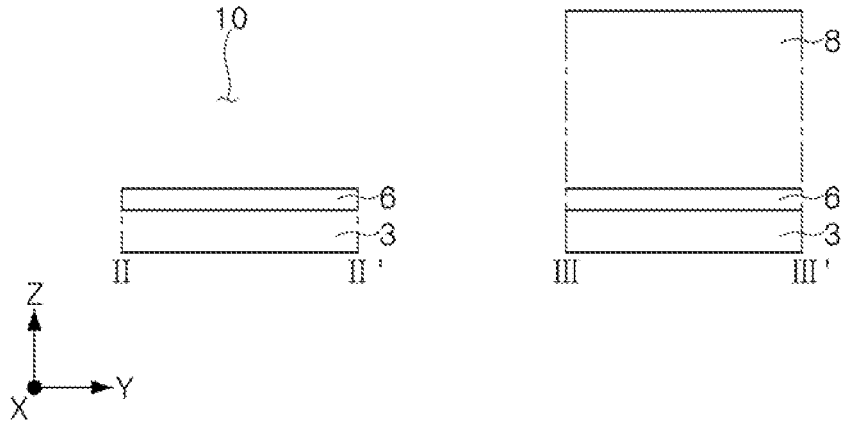

Referring to FIGS. 13, 14A, and 14B, semiconductor lines may be formed using a silicon on insulator (SOI) substrate. In an implementation, in an SOI substrate including a lower single crystal semiconductor layer—an insulating layer—an upper single crystal semiconductor layer, first preliminary semiconductor patterns 8 having openings 10 may be formed by patterning an upper single crystal semiconductor layer. Accordingly, the first preliminary semiconductor patterns 8 may be formed on an insulating layer 6 of the SOI substrate. The insulating layer 6 may be formed on a lower substrate 3, which may be a lower single crystal semiconductor layer of the SOI substrate. The first preliminary semiconductor patterns 8 may be formed of a single crystal semiconductor, e.g., single crystal silicon. Each of the first preliminary semiconductor patterns 8 may have a line shape extending in the first direction Y.

Figure 15A:
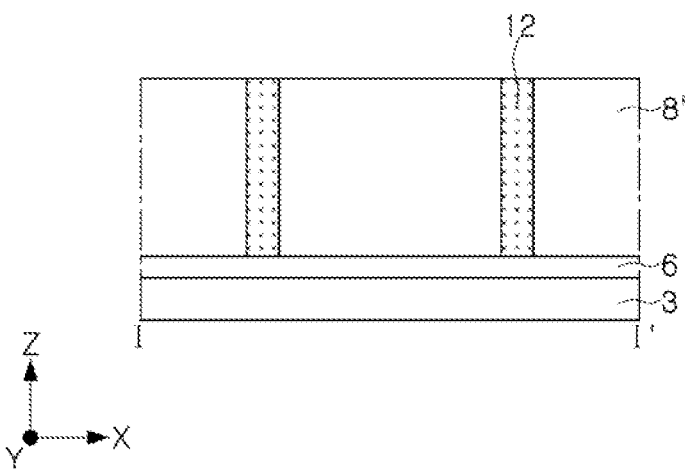
Figure 15B:
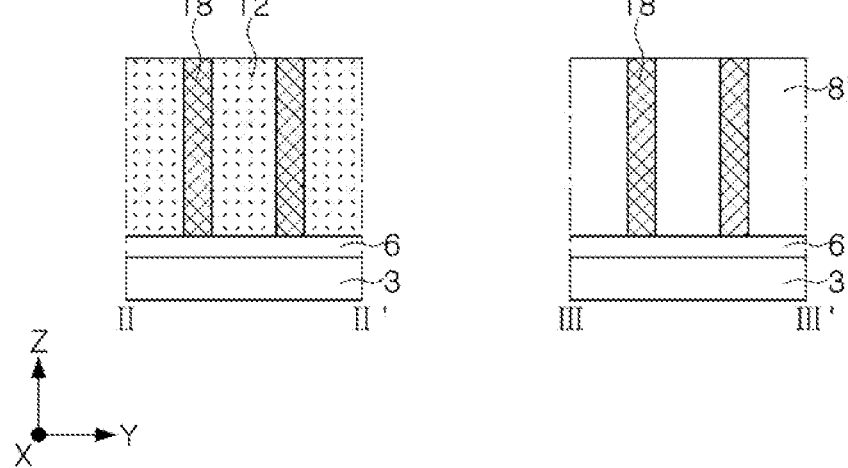

Referring to FIGS. 13, 15A, and 15B, complementary structures 12 may be formed to fill the openings (10 in FIGS. 14A and 14B). Each of the complementary structures 12 may include an oxide semiconductor layer. Isolation patterns 18 extending in a second direction X, perpendicular to the first direction Y, and passing through the first preliminary semiconductor patterns 8 may be formed. The first preliminary semiconductor patterns 8 may be formed as second preliminary semiconductor patterns 8' by the isolation patterns 18. The isolation patterns 18 may be formed of an insulating material.

In an implementation, forming the complementary structures 12 may include filling the openings (10 in FIGS. 14A and 14B) with an oxide semiconductor material.

In an implementation, forming the complementary structures 12 may include forming first layers (112a in FIG. 4A) on sidewalls of the openings (10 in FIGS. 14A and 14B), and forming a second layer (112b in FIG. 4A) filling the openings (10 in FIGS. 14A and 14B) on the first layers (112a in FIG. 4A).

In an implementation, forming the complementary structures 12 may include sequentially forming first layers (212a in FIG. 10A) and second layers (212b in FIG. 10A) on sidewalls of the openings (10 in FIGS. 14A and 14B), and forming a third layer (212c in FIG. 10A) covering the first layers (212a in FIG. 10A) and the second layers (212b in FIG. 10A), and filling the openings (10 in FIGS. 14A and 14B).

Figure 16:
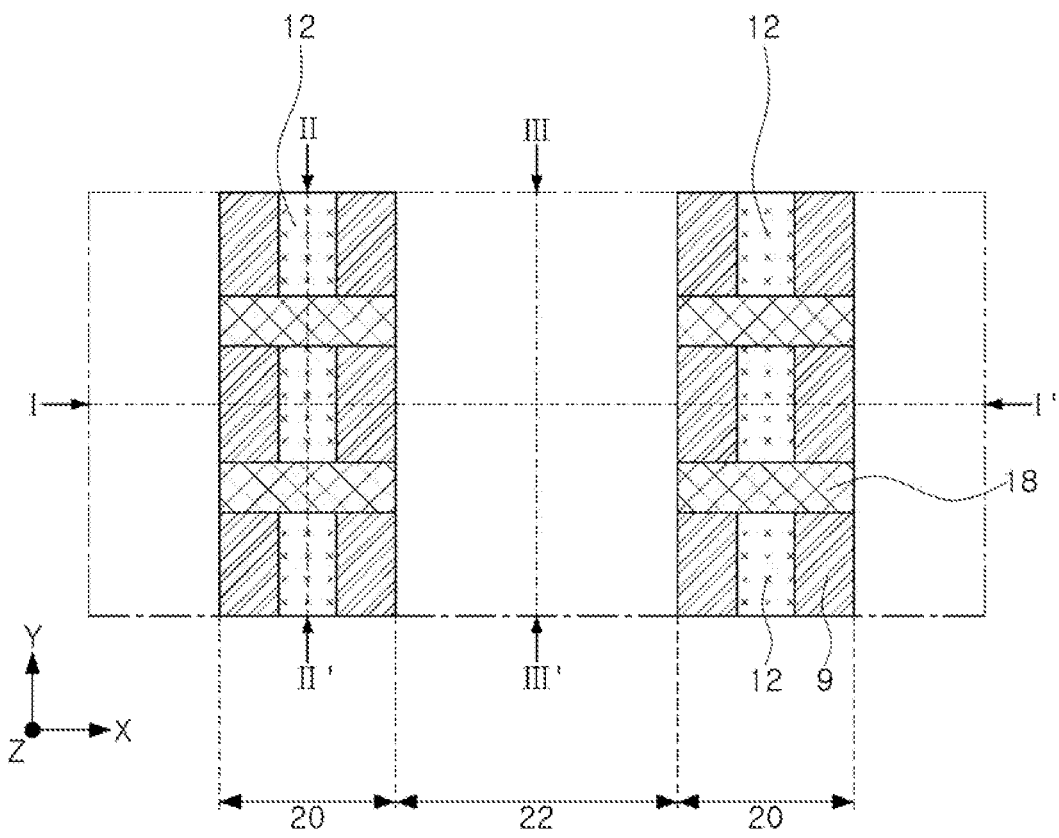
Figure 17A:
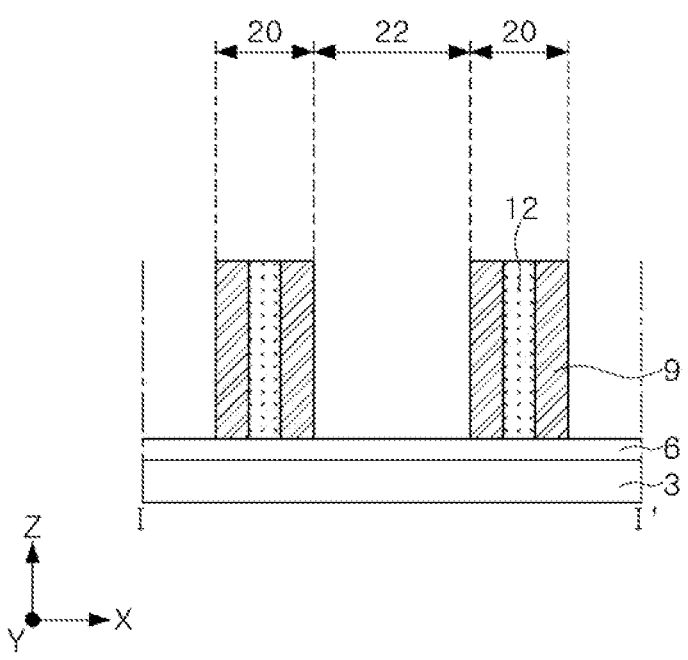
Figure 17B:
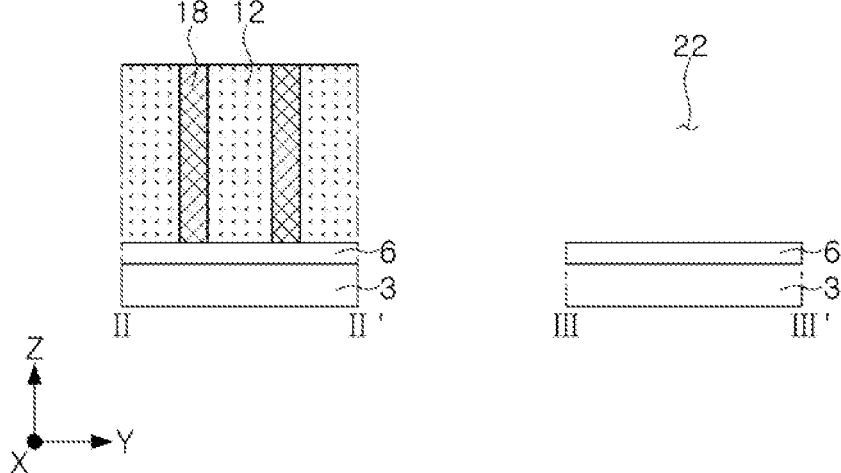

Referring to FIGS. 16, 17A and 17B, the second preliminary semiconductor patterns 8' may be patterned to form semiconductor patterns 9. While the second preliminary semiconductor patterns 8' are patterned, the isolation patterns 18 may also be patterned.

The semiconductor patterns 9, the isolation patterns 18, and the complementary structures 12 may be included in the structures 20. An opening 22 may be formed between the structures 20. The structures 20 may have a line shape extending in the first direction Y.

Figure 18:
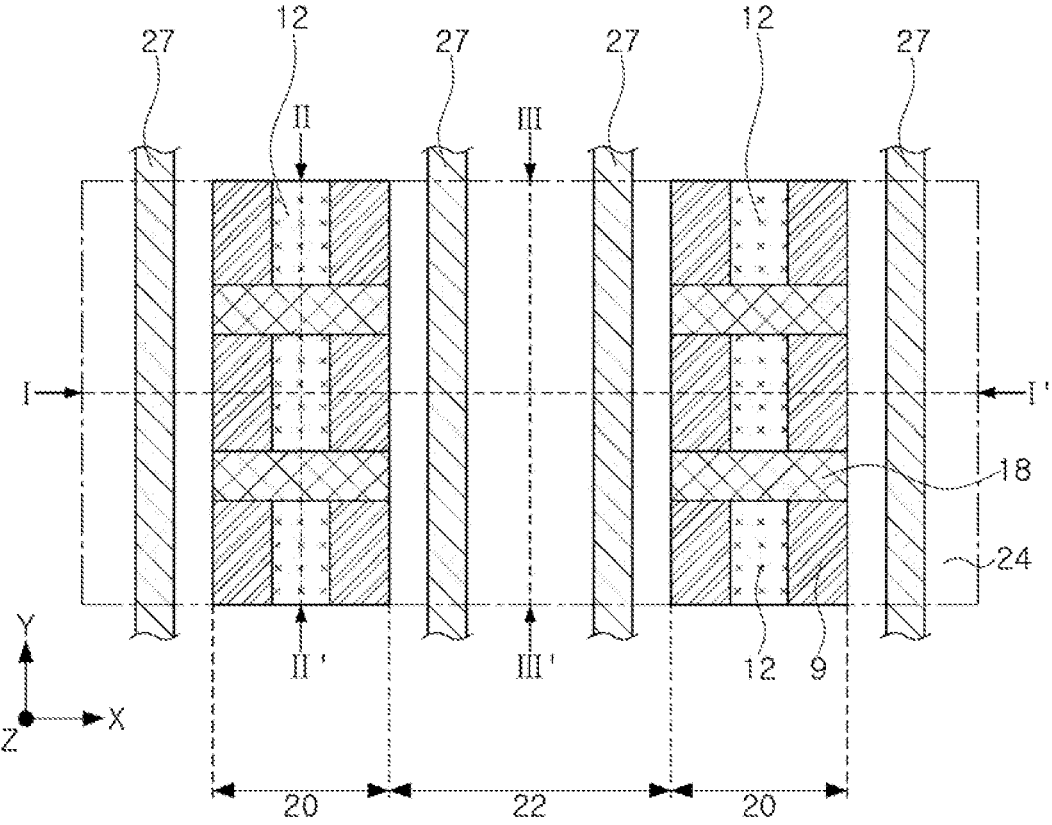
Figure 19A:
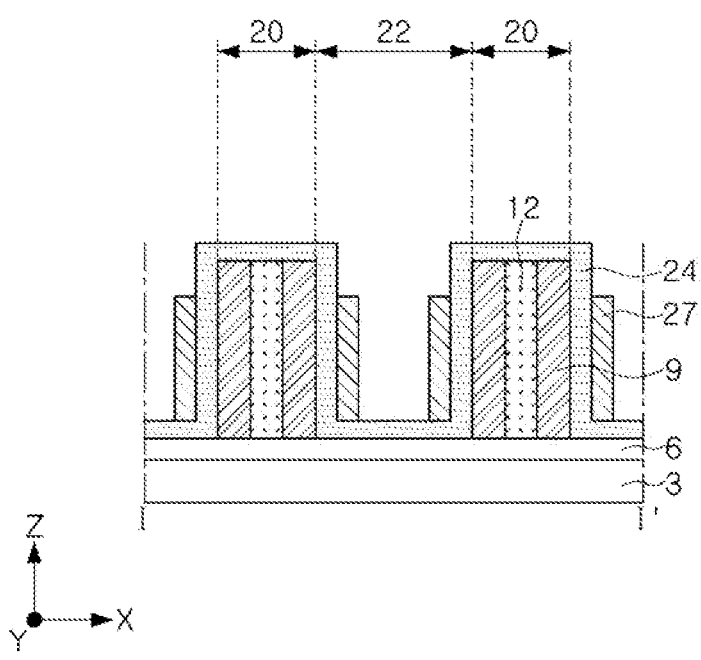
Figure 19B:
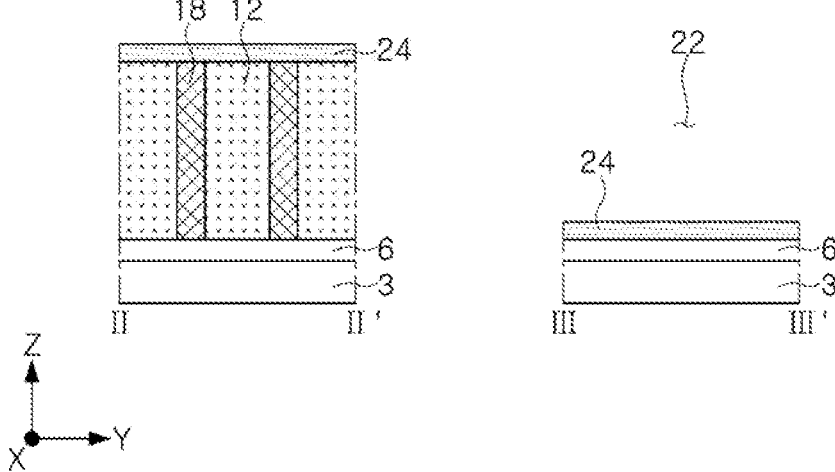

Referring to FIGS. 18, 19A and 19B, a gate dielectric layer 24 covering an upper surface and side surfaces of each of the structures 20 and covering a bottom surface of the opening 22 may be conformally formed. Conductive lines 27 facing side surfaces of the structures 20 may be formed on the gate dielectric layer 24.

Figure 20A:
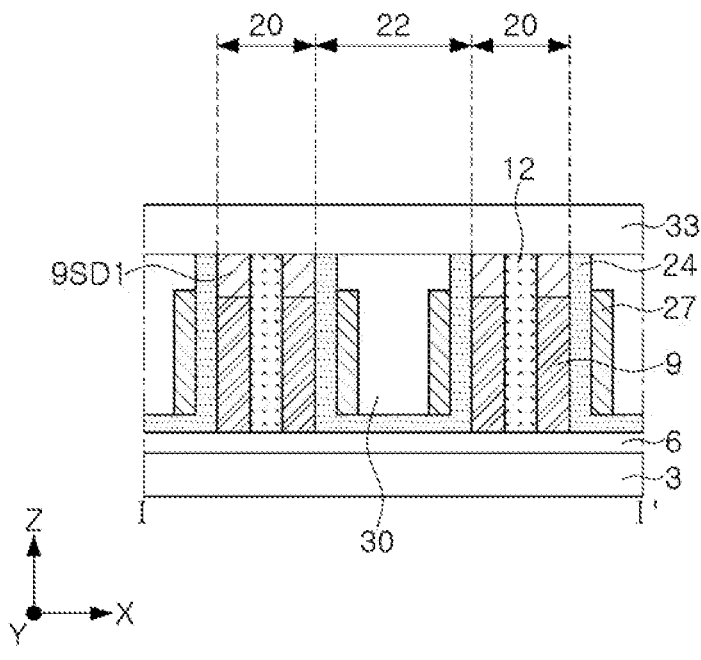
Figure 20B:
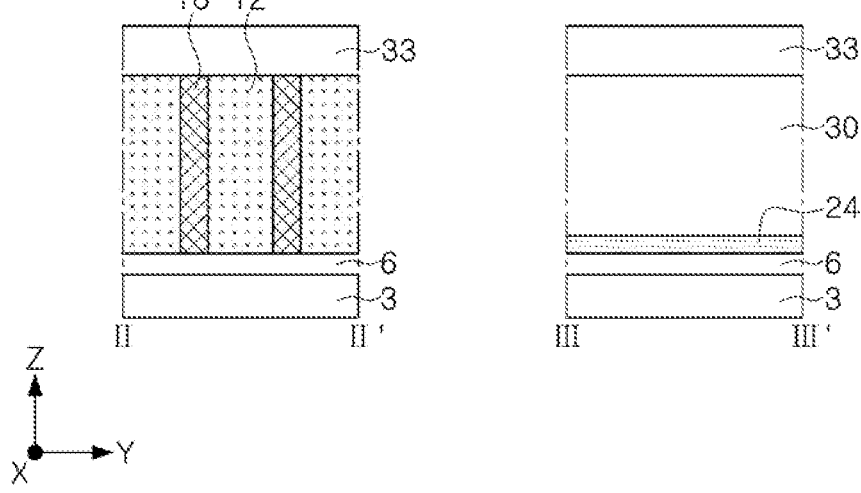

Referring to FIGS. 18, 20A, and 20B, an intermediate insulating layer 30 covering the gate dielectric layer 24 and the conductive lines 27, and filling the opening (22 in FIGS. 18, 19A and 19B) may be formed.

In an implementation, the intermediate insulating layer 30 may have an air gap (130a in FIG. 8A) in the opening (22 in FIGS. 18, 19A and 19B).

In an implementation, forming an intermediate shielding conductive line (128 in FIGS. 7A and 7B) passing through the intermediate insulating layer 30 may be further included.

An ion implantation process may be performed to form first source/drain regions 9SD1 in upper regions of the semiconductor patterns 9. An insulating layer 33 may be formed on the intermediate insulating layer 30 and the semiconductor patterns 9.

Figure 21:
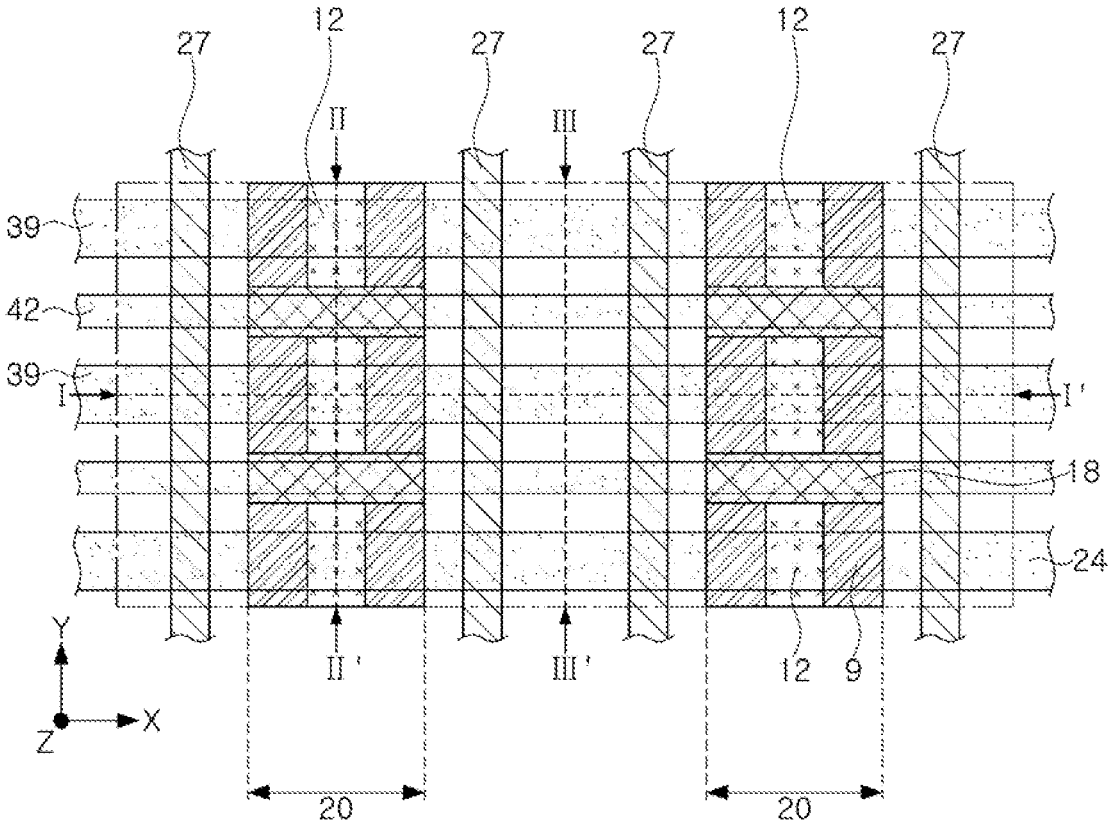
Figure 22A:
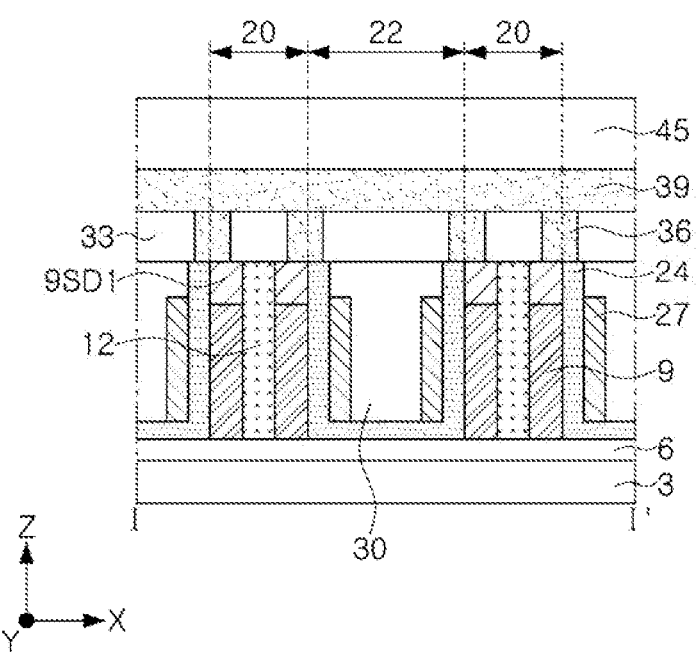
Figure 22B:
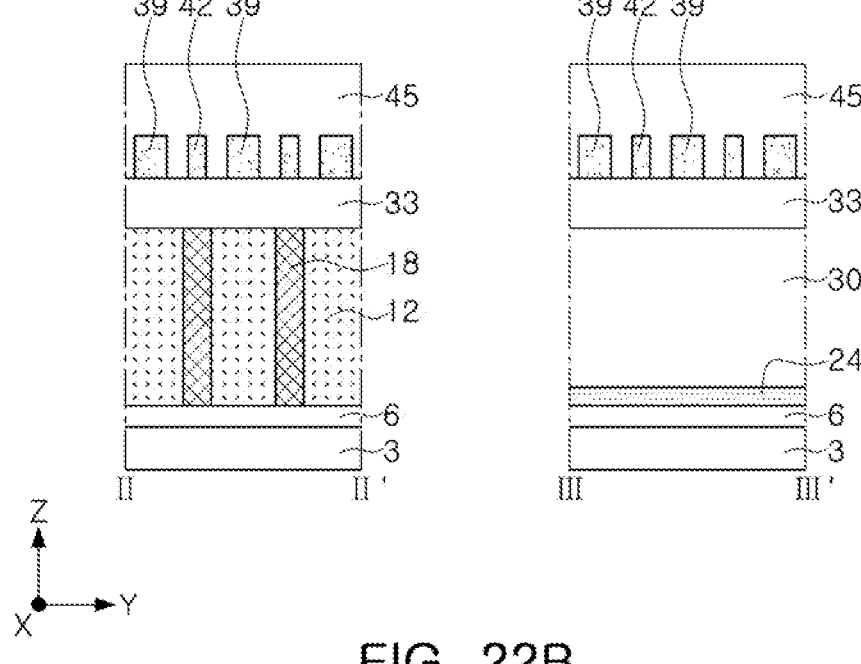

Referring to FIGS. 21, 22A and 22B, contact structures 36 passing through the insulating layer 33 and electrically connected to the first source/drain regions 9SD1 may be formed. Conductive lines electrically connected to the contact structures 36, e.g., bit lines 39 may be formed on the insulating layer 33. An insulating layer 45 covering the bit lines 39 may be formed on the insulating layer 33.

Figure 23A:
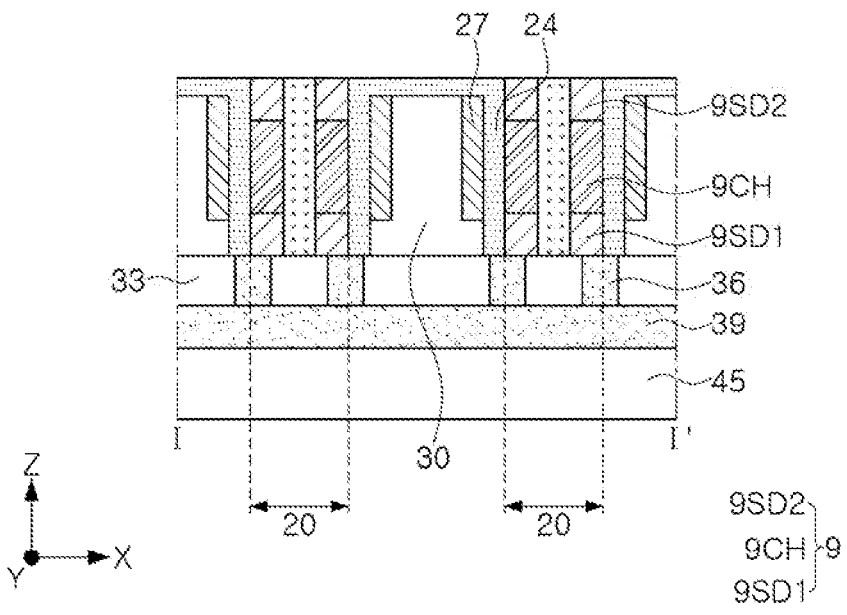
Figure 23B:
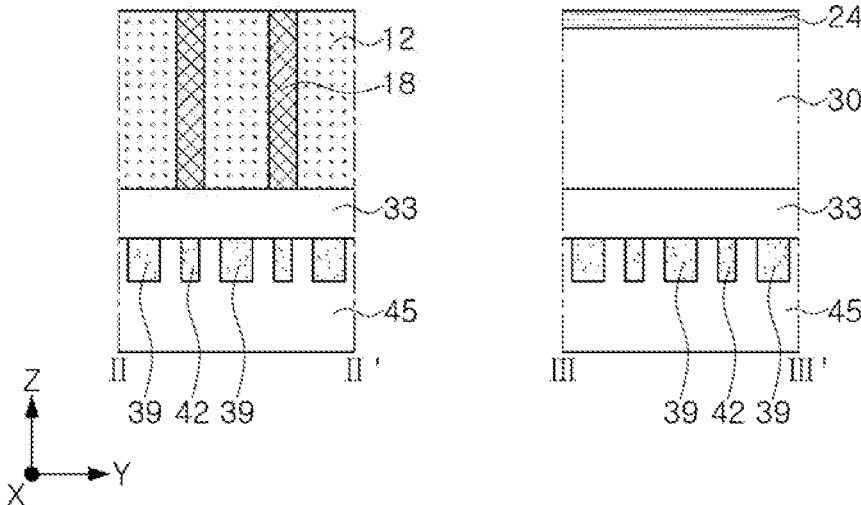

Referring to FIGS. 23A and 23B, the insulating layer 6 and the lower substrate 3 may be sequentially removed to expose the semiconductor patterns 9. Subsequently, an ion implantation process may be performed to form second source/drain regions 9SD2 in the semiconductor patterns 9. The second source/drain regions 9SD2 and the first source/drain regions 9SD1 may be spaced apart from each other in a vertical direction Z. In the semiconductor patterns 9, regions between the second source/drain regions 9SD2 and the first source/drain regions 9SD1 may be defined as vertical channel regions 9CH.

Referring back to FIGS. 1, 2A, and 2B, an upper insulating layer 50 may be formed on the second source/drain regions 9SD2 and the intermediate insulating layer 30. Upper contact structures 53 buried in the upper insulating layer 50 or passing through the upper insulating layer 50 may be formed. Each of the upper contact structures 53 may include a plug portion 55 and a pad portion 57 on the plug portion 55. The plug portions 55 of the upper contact structures 532 may be in contact with and electrically connected to the second source/drain regions 9SD2 of the semiconductor patterns 9.

A data storage structure 60 may be formed on the upper insulating layer 50 and the upper contact structures 53. The data storage structure 60 may include first electrodes 62 in contact with the upper contact structures 53, a dielectric layer 64 on the first electrodes 62, and a second electrode 66 on the dielectric layer 64.

According to example embodiments, there may be provided a complementary structure including a semiconductor pattern including a vertical channel region and an oxide semiconductor layer capable of removing charges trapped in the vertical channel region of the semiconductor pattern. During repeated ON-OFF operations of transistors, the charges could be trapped in the vertical channel region to be accumulated, and the complementary structure including the oxide semiconductor layer may help prevent occurrence of defects in the semiconductor device by the charges accumulated in the vertical channel region.

In an example embodiment, the vertical channel region may be formed of a single crystal semiconductor, and thus the semiconductor device may have improved charge mobility and on-current properties.

In an example embodiment, the complementary structure including the oxide semiconductor layer may be provided, thereby preventing degradation of performance of the semiconductor device, which could otherwise occur due to a floating body effect in the vertical channel region of the semiconductor pattern.

One or more embodiments may provide a semiconductor device having a high degree of integration.

One or more embodiments may provide a semiconductor device having improved electrical performance.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a first single crystal semiconductor pattern including a first source/drain region, a second source/drain region, and a first vertical channel region between the first source/drain region and the second source/drain region, the second source/drain region being at a higher vertical level than the first source/drain region;
a first gate electrode facing a first side surface of the first single crystal semiconductor pattern;
a first gate dielectric layer, the first gate dielectric layer including a portion between the first single crystal semiconductor pattern and the first gate electrode;
a complementary structure in contact with and at the same vertical level along a horizontal plane as a second side surface of the first single crystal semiconductor pattern at a level of the first vertical channel region; and
a lower conductive line disposed below the first single crystal semiconductor pattern, the first gate electrode, and the complementary structure,
wherein the complementary structure includes an oxide semiconductor layer,
wherein the lower conductive line extends in a first direction and is electrically connected to the first single crystal semiconductor pattern, and
wherein the first single crystal semiconductor pattern is disposed, in the first direction and at the vertical level along the horizontal plane, between the complementary structure and the first gate electrode.

2. The semiconductor device as claimed in claim 1, wherein the first single crystal semiconductor pattern is a single crystal silicon pattern, and wherein the oxide semiconductor layer includes indium and/or zinc.

3. The semiconductor device as claimed in claim 1, wherein the oxide semiconductor layer of the complementary structure is in contact with the first single crystal semiconductor pattern.

4. The semiconductor device as claimed in claim 1, wherein the first side surface and the second side surface of the first single crystal semiconductor pattern oppose each other.

5. The semiconductor device as claimed in claim 1, wherein the oxide semiconductor layer of the complementary structure has an energy band gap greater than an energy band gap of the first single crystal semiconductor pattern.

6. The semiconductor device as claimed in claim 1, further comprising:
a second single crystal semiconductor pattern at the same vertical level as the first single crystal semiconductor pattern;
a second gate electrode parallel to the first gate electrode; and
a second gate dielectric layer, the second gate dielectric layer including a portion between the second gate electrode and the second single crystal semiconductor pattern,
wherein:
a portion of a structure including the first single crystal semiconductor pattern, the complementary structure, and the second single crystal semiconductor pattern all at the same vertical level as each other along the horizontal plane is between the first gate electrode and the second gate electrode at the same vertical level as the first gate electrode and the second gate electrode along the horizontal plane,
the complementary structure is between the first single crystal semiconductor pattern and the second single crystal semiconductor pattern,
the second single crystal semiconductor pattern includes a third source/drain region, a fourth source/drain region, and a second vertical channel region between the third and fourth source/drain regions, and
the fourth source/drain region is at a higher vertical level than the third source/drain region.

7. The semiconductor device as claimed in claim 6, wherein:
an upper surface of each of the first single crystal semiconductor pattern and the second single crystal semiconductor pattern is at a higher vertical level than an upper surface of each of the first gate electrode and the second gate electrode, and
a lower surface of each of the first single crystal semiconductor pattern and the second single crystal semiconductor pattern is at a lower vertical level than a lower surface of each of the first gate electrode and the second gate electrode.

8. The semiconductor device as claimed in claim 6, wherein the oxide semiconductor layer of the complementary structure includes at least two layers having different energy band gaps.

9. The semiconductor device as claimed in claim 6, wherein:
the complementary structure further includes an insulating layer in contact with the oxide semiconductor layer,
the insulating layer is between the first single crystal semiconductor pattern and the second single crystal semiconductor pattern, and
the oxide semiconductor layer includes:
a first oxide semiconductor portion between the first single crystal semiconductor pattern and the insulating layer, and
a second oxide semiconductor portion between the second single crystal semiconductor pattern and the insulating layer.

10. The semiconductor device as claimed in claim 9, wherein:
the complementary structure further includes an intermediate shielding conductive line, the intermediate shielding conductive line is between the first single crystal semiconductor pattern and the second single crystal semiconductor pattern, and the intermediate shielding conductive line is spaced apart from the oxide semiconductor layer of the complementary structure by the insulating layer.

11. The semiconductor device as claimed in claim 1, further comprising:

a data storage structure at a higher vertical level than that of the first gate electrode and at a higher vertical level than that of the first single crystal semiconductor pattern.

12. The semiconductor device as claimed in claim 11, further comprising:

a lower contact structure between the first source/drain region and the lower conductive line, the lower contact structure electrically connecting the first source/drain region and the lower conductive line to each other; and an upper contact structure between the second source/drain region and the data storage structure, the upper contact structure electrically connecting the second source/drain region and the data storage structure to each other.

13. The semiconductor device as claimed in claim 11, wherein the data storage structure is a Dynamic Random Access Memory (DRAM) capacitor configured to store data on a DRAM or a ferroelectric capacitor configured to store data on a ferroelectric Random Access Memory.

14. A semiconductor device, comprising:

a first conductive line and a second conductive line at a first vertical level, the first conductive line and the second conductive line being parallel to each other;

a first single crystal semiconductor pattern and a second single crystal semiconductor pattern at the first vertical level and spaced apart from each other;

a complementary structure between the first single crystal semiconductor pattern and the second single crystal semiconductor pattern in a first direction, the complementary structure including an oxide semiconductor layer; and lower conductive line disposed below the first conductive line, the second conductive line, the first single crystal semiconductor pattern, the second single crystal semiconductor pattern, and the complementary structure, wherein the first single crystal semiconductor pattern, the second single crystal semiconductor pattern, and the complementary structure are between the first conductive line and the second conductive line along a horizontal plane at the first vertical level, and wherein the lower conductive line extends in the first direction and is electrically connected to the first single crystal semiconductor pattern and the second single crystal semiconductor pattern.

15. The semiconductor device as claimed in claim 14, further comprising:

a data storage structure at a higher vertical level than the first single crystal semiconductor pattern, the second single crystal semiconductor pattern, and the complementary structure, wherein:

each of the first single crystal semiconductor pattern and the second single crystal semiconductor pattern includes a first source/drain region having a first conductivity type, a second source/drain region on the first source/drain region and having the first conductivity type, and a vertical channel region between the first and second source/drain regions and having a second conductivity type different from the first conductivity type, the oxide semiconductor layer includes indium and/or zinc, the oxide semiconductor layer of the complementary structure includes a first oxide semiconductor portion in contact with the vertical channel region of the first single crystal semiconductor pattern and a second oxide semiconductor portion in contact with the vertical channel region of the second single crystal semiconductor pattern, the first source/drain regions of the first single crystal semiconductor pattern and the second single crystal semiconductor pattern are electrically connected to the lower conductive line, and the second source/drain regions of the first single crystal semiconductor pattern and the second single crystal semiconductor pattern are electrically connected to electrodes of the data storage structure.

16. The semiconductor device as claimed in claim 15, further comprising:

lower contact structures between the lower conductive line and the first source/drain regions of the first single crystal semiconductor pattern and the second single crystal semiconductor pattern; and upper contact structures between the data storage structure and the second source/drain regions of the first single crystal semiconductor pattern and the second single crystal semiconductor pattern.

17. A semiconductor device, comprising:

first single crystal semiconductor patterns spaced apart from each other in a first direction;

second single crystal semiconductor patterns spaced apart from each other in the first direction, and spaced apart from the first single crystal semiconductor patterns in a second direction, intersecting the first direction; and complementary structures between the first single crystal semiconductor patterns and the second single crystal semiconductor patterns, wherein:

each of the complementary structures is between adjacent ones of the first single crystal semiconductor patterns and the second single crystal semiconductor patterns in the second direction, each of the first single crystal semiconductor patterns and the second single crystal semiconductor patterns includes a first semiconductor material having a first energy band gap, and each of the complementary structures includes a second semiconductor material having a second energy band gap greater than the first energy band gap, and the second semiconductor material is an oxide semiconductor that includes indium and/or zinc.

18. The semiconductor device as claimed in claim 17, wherein:

the first semiconductor material is single crystal silicon.

19. The semiconductor device as claimed in claim 18, wherein the oxide semiconductor includes an indium gallium zinc oxide material including about 40 at % or less of In or about 40 at % or more of Ga.

20. The semiconductor device as claimed in claim 18, wherein the second semiconductor material is in contact with the first semiconductor material.

* * * * *